(12) United States Patent
Izumi et al.

(10) Patent No.: US 8,183,109 B2
(45) Date of Patent: May 22, 2012

(54) SEMICONDUCTOR DEVICE AND METHOD OF MANUFACTURING THE SAME

(75) Inventors: Kazutoshi Izumi, Kawasaki (JP); Kouichi Koseko, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 259 days.

(21) Appl. No.: 12/731,538

(22) Filed: Mar. 25, 2010

(65) Prior Publication Data

US 2010/0184240 A1 Jul. 22, 2010

Related U.S. Application Data

(62) Division of application No. 11/398,641, filed on Apr. 6, 2006, now abandoned.

(30) Foreign Application Priority Data

Jan. 26, 2006 (JP) .................................. 2006-017702

(51) Int. Cl.
*H01L 21/8242* (2006.01)

(52) U.S. Cl. .............................. 438/253; 438/3; 438/396

(58) Field of Classification Search .............. 438/3, 239, 438/240, 250, 253, 255, 256, 386, 388, 393, 438/396, 399
See application file for complete search history.

(56) References Cited

U.S. PATENT DOCUMENTS

| | | | |
|---|---|---|---|
| 5,153,689 A | 10/1992 | Okumura et al. | |
| 5,472,901 A | 12/1995 | Kapoor | |
| 5,737,260 A | 4/1998 | Takata et al. | |
| 5,916,820 A | 6/1999 | Okumura et al. | |
| 5,930,618 A | 7/1999 | Sun et al. | |
| 6,169,324 B1 | 1/2001 | Sugiura et al. | |
| 6,211,035 B1 * | 4/2001 | Moise et al. | 438/396 |
| 6,673,672 B2 | 1/2004 | Sashida | |
| 7,528,432 B2 | 5/2009 | Sashida | |
| 2002/0006674 A1 * | 1/2002 | Ma et al. | 438/3 |
| 2002/0021544 A1 * | 2/2002 | Cho et al. | 361/200 |
| 2002/0127867 A1 * | 9/2002 | Lee | 438/694 |
| 2004/0046185 A1 | 3/2004 | Sashida | |

FOREIGN PATENT DOCUMENTS

| | | |
|---|---|---|
| JP | 2819774 B2 | 11/1998 |
| JP | 2913672 B2 | 6/1999 |
| JP | 3080843 B2 | 8/2000 |
| JP | 2003-273332 A | 9/2003 |
| JP | 3482199 B2 | 12/2003 |

OTHER PUBLICATIONS

Japanese Office Action dated Sep. 28, 2010, issued in corresponding Japanese Patent Application No. 2006-017702.

* cited by examiner

*Primary Examiner* — Kevin M Picardat
(74) *Attorney, Agent, or Firm* — Westerman, Hattori, Daniels & Adrian, LLP

(57) ABSTRACT

Disclosed is a method of manufacturing a semiconductor device, which comprises the steps of: forming a hydrogen diffusion preventing insulating film covering capacitors; forming a capacitor protecting insulating film on the hydrogen diffusion preventing insulating film; and forming a first insulating film on the capacitor protecting insulating film by a plasma CVD method where, while a high-frequency bias electric power is applied toward the semiconductor substrate, a plasma-generating high frequency electric power is applied to first deposition gas containing oxygen and silicon compound gas. In the method, a condition by which moisture content in the capacitor protecting insulating film becomes less than that in the first insulating film is adopted as a film deposition condition for the capacitor protecting insulating film.

14 Claims, 27 Drawing Sheets

A: with bias, SiH$_4$: 70sccm, Ar: 420sccm, O$_2$: 525sccm
B: with bias, SiH$_4$: 56sccm, Ar: 300sccm, O$_2$: 300sccm
C: with bias, SiH$_4$: 70sccm, Ar: 300sccm, O$_2$: 525sccm
D: without bias, SiH$_4$: 70sccm, Ar: 420sccm, O$_2$: 525sccm
E: without bias, SiH$_4$: 70sccm, Ar: 420sccm, O$_2$: 300sccm
F: silicon oxide film is not formed (silicon substrate only)

SEMICONDUCTOR DEVICE AND METHOD OF MANUFACTURING THE SAME

CROSS-REFERENCE TO RELATED APPLICATIONS

This application is a divisional application of U.S. Ser. No. 11/398,641, filed Apr. 6, 2006, which is based on and claims priority of Japanese Patent Application No. 2006-017702 filed on Jan. 26, 2006, the entire contents of which are incorporated herein by reference.

BACKGROUND OF THE INVENTION

1. Field of the Invention

The present invention relates to a semiconductor device and a method of manufacturing the same.

2. Description of the Related Art

As nonvolatile memories capable of storing information even after the power therefore is turned off, a flash memory and a ferroelectric memory are known.

Among these memories, the flash memory contains a floating gate buried in a gate insulating film of an insulated gate field-effect transistor (IGFET), and stores information by accumulating electric charges indicating memory information in the floating gate. However, this type of the flash memory has a drawback of requiring relatively high voltages, since tunnel currents should flow through the gate insulating film in writing and deleting of the information.

On the other hand, the ferroelectric memory, which is also called FeRAM (Ferroelectric Random Access Memory), stores the information by utilizing a hysteresis property of a ferroelectric film provided in a ferroelectric capacitor. The ferroelectric film causes polarization in accordance with an electric voltage applied between a lower electrode and an upper electrode of the capacitor, and spontaneous polarization remains even after the applied electric voltage is removed. If polarity of the applied electric voltage is reversed, this spontaneous polarization is also reversed. Subsequently by setting directions of the spontaneous polarization corresponding to "1" and "0," the information is written into the ferroelectric film. The FeRAM has advantages that an electric voltage required for writing information is lower than that of the flash memory, and that writing can be performed at a higher speed than that of the flash memory.

In the FeRAM, spaces between wirings and those between adjacent capacitors have been becoming narrower and narrower in response to miniaturization of semiconductor devices in recent years.

While the spaces between wirings and between capacitors in the FeRAM have to be filled with an insulating film such as silicon oxide film, there is a risk of causing voids in the insulating film in the aforementioned narrow spaces if a gap-filling property of the insulating film is inadequate.

In response, a silicon oxide film having an excellent gap-filling property, which is formed by an HDP (High Density Plasma) CVD method, has been used as the insulating film for the FeRAM in recent years.

FIG. 1 is a schematic diagram for explaining a reason why the gap-filling property are enhanced in the HDPCVD method.

In an example shown in FIG. 1, a silicon oxide film 113 is formed on metal wirings 112 by using $SiH_4$ (silane), $O_2$ (oxygen) and Ar (argon) as a film deposition gas in the HDPCVD method. In the HDPCVD method, while a high-frequency plasma-generating electric power, which makes the film deposition gas into plasma, is applied from above a silicon substrate 111, a high-frequency bias electric power is applied from under the silicon substrate 111.

The high-frequency bias electric power serves to pull oxygen radicals and argon ions toward the substrate in a film deposition atmosphere. Therefore, a process of film deposition and a process of sputter-etching by the radicals and ions are simultaneously performed in the HDPCVD method. As such, the silicon oxide film 113 on shoulders 112b of the metal wirings 112 is scraped off by the sputter-etching, which thereby makes possible to prevent the formation of overhanging portions 113a of the silicon oxide film 3 in the vicinities of the shoulders 112b. As a result, it becomes possible to preferably embed the silicon oxide film 113 in the narrow spaces between each of the metal wiring 112 while inhibiting the voids from occurring in these spaces.

Patent Literature 1 discloses a silicon oxide film formed by the above-described HDPCVD method for an insulating film of filling spaces between adjacent ferroelectric capacitors.

In addition to the Patent Literature 1, technologies related to the present application is disclosed in Patent Literatures 2 to 4.

Among these literatures, Patent Literature 2 discloses a film deposition method including two steps, in which a substrate position is changed in an ECR (electron cyclotron resonance) plasma CVD apparatus Additionally, Patent Literature 3 discloses that three insulating films are laminated by changing their deposition condition in the ECR plasma CVD apparatus.

Furthermore, Patent Literature 4 discloses that void-free thin film is formed on a stepped substrate by alternately repeating a sputter-etching and film deposition utilizing a capacitively coupled discharge in the plasma CVD apparatus

[Patent Literature 1] Japanese Patent No. 3482199 Specification

[Patent Literature 2] Japanese Patent No. 2913672 Specification

[Patent Literature 3] Japanese Patent No. 2819774 Specification

[Patent Literature 4] Japanese Patent No. 3080843 Specification

Incidentally, a capacitor dielectric film constituting the ferroelectric capacitor of the FeRAM is formed of a metal oxide or the like. Therefore, the capacitor dielectric film is easily deoxidized and brought into an oxygen deficient state when it is exposed to a reducing atmosphere which contains hydrogen, moisture, and the like. The capacitor dielectric film in the oxygen deficient state exhibits poor ferroelectric property. Accordingly, it is important how to prevent the capacitor dielectric film from being reduced in the manufacturing processes of the FeRAM. This is also the case where the HDPCVD method is employed in the manufacturing processes of the FeRAM.

SUMMARY OF THE INVENTION

According to one aspect of the present invention, there is provided a method of manufacturing a semiconductor device, comprising the steps of: forming a base insulating film on a semiconductor substrate; forming a capacitor on the base insulating film, the capacitor being constructed by laminating a lower electrode, a capacitor dielectric film formed of a ferroelectric material, and an upper electrode; forming a hydrogen diffusion preventing insulating film covering the capacitor; forming a capacitor protecting insulating film on the hydrogen diffusion preventing insulating film; and forming a first insulating film on the capacitor protecting insulating film by a plasma CVD method where, while a high-frequency bias electric power is applied toward the semiconductor substrate, a plasma-generating high frequency electric power is applied to first deposition gas containing oxygen and silicon compound gas, wherein a condition by which moisture content in the capacitor protecting insulating film becomes less than that in the first insulating film is employed as a deposition condition for the capacitor protecting insulating film.

In the case where the first insulating film is formed by the plasma CVD method using a high frequency bias electric power as in the present invention, if moisture content in the capacitor protecting insulting film under the first insulating film is high, ferroelectric property of the capacitor dielectric film is notably deteriorated due to moisture.

In consideration of this problem, moisture content in the capacitor protecting insulating film is made less than that in the first insulating film, whereby deterioration of the capacitor protecting insulating film due to moisture can be prevented in the present invention.

When the first insulating film is deposited, the high-frequency bias electric power causes sputter-etching in parallel with the film deposition. However, the abovementioned capacitor protecting insulating film functions so as to protect the hydrogen diffusion preventing insulating film from the sputter-etching. Therefore, the hydrogen diffusion preventing insulating film can be prevented from being etched, whereby it becomes easier to block intrusion of reductant such as hydrogen into the capacitor dielectric film by means of the hydrogen diffusion preventing insulting film.

According to another aspect of the present invention, there is provided a method of manufacturing a semiconductor device, comprising the steps of: forming a base insulating film on a semiconductor substrate; forming capacitor on the base insulating film, the capacitor being constructed by laminating a lower electrode, a capacitor dielectric film composed of a ferroelectric material, and an upper electrode; forming a first insulating film covering the capacitors; forming a metal wiring on the first insulating film; forming a wiring protection insulating film on the metal wiring and on the first insulating film; and forming a second insulating film on the wiring protection insulating film by a plasma CVD method where, while a high-frequency bias electric power is applied toward the semiconductor substrate, a plasma-generating high-frequency electric power is applied to a first deposition gas containing oxygen and silicon compound gas, wherein a condition by which moisture content in the wiring protection insulating film becomes less than that in the second insulating film is employed as a deposition condition for the wiring protection insulating film.

According to the present invention, moisture content in the wiring protection insulating film is made less than that in the second insulating film. Therefore, deterioration of the capacitor dielectric film due to moisture can be prevented when the second insulating film is deposited.

Additionally, when the second insulating film is deposited by using the high-frequency bias electric power, the wiring protection insulating film serves to protect the metal wiring from sputter-etching, which progresses in parallel with the film deposition, and thereby preventing the metal wiring from being etched.

Particularly, in the case of using a metal laminated film made by laminating at least an aluminum alloy film and a reflection preventing metal film in this order as the metal wiring, if the aforementioned wiring protection insulating film is absent, the reflection preventing metal film is etched, so that the thickness of the reflection preventing metal film on the shoulder of the metal wiring notably reduces. In this case, if a hole formed in the second insulating film is displaced to be formed on the shoulder of the metal wiring, thin reflection preventing metal film is etched in an etching step for forming the hole, and thus the aluminum alloy film is exposed through a bottom of the hole. In this situation, a conductive plug formed in the hole comes to in contact with the aluminum alloy film, and consequently, there arises a disadvantage that contact resistance between the conductive plug and the metal wiring increases.

On the other hand, in the present invention, the wiring protection insulating film protects the reflection preventing metal film against sputter-etching at the time of forming the second insulating film. Therefore, it is possible to prevent the reflection preventing metal film from being etched in forming the hole in the second insulating film. Accordingly, the aluminum alloy film is prevented from exposing through the bottom of the hole, whereby it becomes possible to suppress an increase in the contact resistance due to direct contact between the aluminum alloy film and the conductive plug.

According to still another aspect of the present invention, there is provided a semiconductor device comprising: a semiconductor substrate; a base insulating film formed on the semiconductor substrate; a capacitor formed on the base insulating film, the capacitor being constructed by laminating a lower electrode, a capacitor dielectric film composed of a ferroelectric material, and an upper electrode; a hydrogen diffusion preventing insulating film covering the capacitor; a capacitor protecting insulating film formed on the hydrogen diffusion preventing insulating film; and a first insulating film formed on the capacitor protecting insulating film, wherein moisture content in the capacitor protecting insulating film is less than that in the first insulating film.

DESCRIPTION OF THE PREFERRED EMBODIMENTS

Hereinafter, a detailed description of the preferred embodiments of the present invention will be provided in referring to the accompanying figures.

(1) First Embodiment

Figure 1:
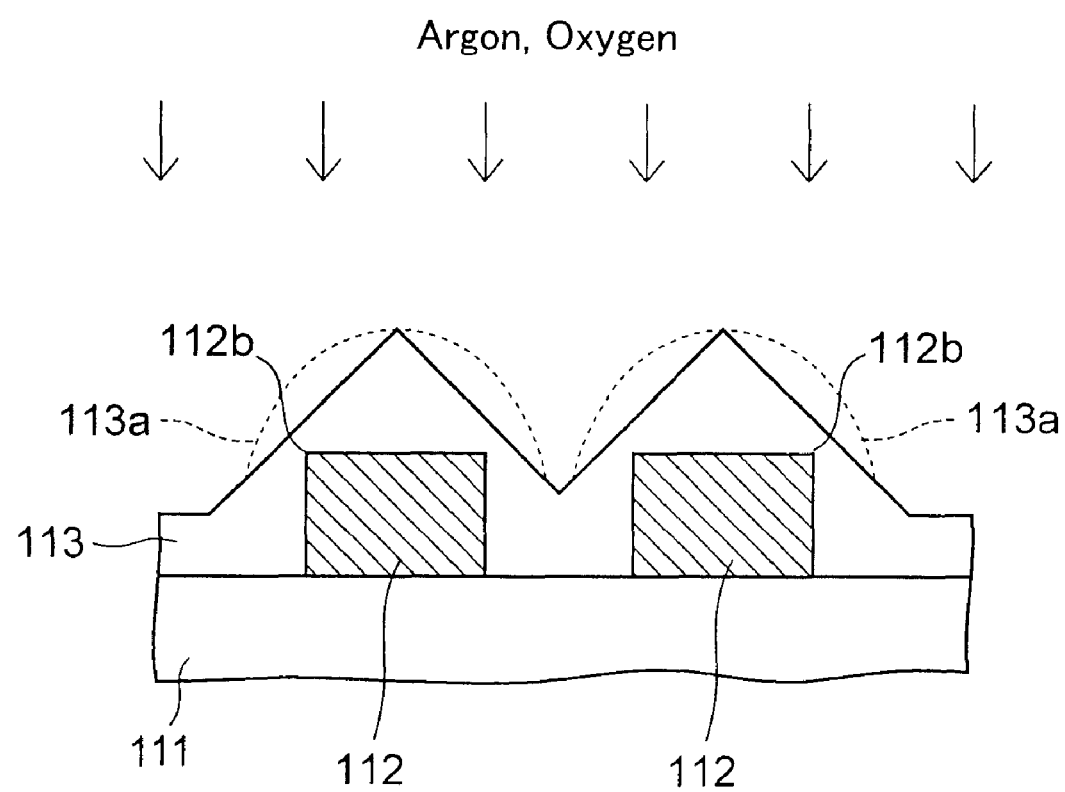
FIG. 1 is a schematic diagram for explaining a reason why the gap-filling property is enhanced through an HDPCVD method.
Figure 2:
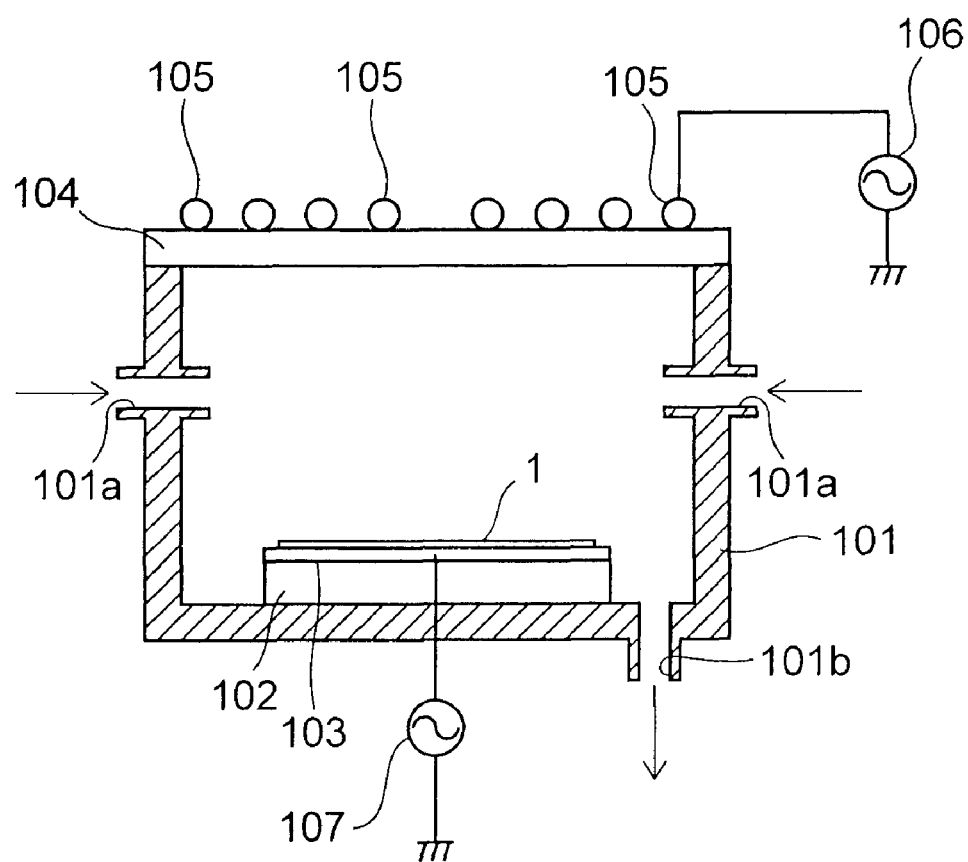
FIG. 2 is a configuration diagram of an HDPCVD chamber used in embodiments of the present invention.

FIG. 2 is a configuration diagram of a HDPCVD chamber 100 used in embodiments of the present invention.

In this chamber 100, gas inlets 101a for introducing film deposition gas are provided in a chamber wall 101 formed of aluminum. Additionally, a stage 102 for mounting a silicon substrate 1 thereon is provided on a lower portion of the chamber 100, and an electrostatic chuck 103 for adsorbing the silicon substrate 1 thereto by an electrostatic force is placed on the stage 102. Note that the stage 102 is made movable both upward and downward, so that the silicon substrate 1 can be held at a height which is the most suitable for film deposition. Moreover, a gas outlet 101b for exhausting reactant gas from inside the chamber 100 is provided in the lower portion of the chamber 100.

On the other hand, a RF (Radio Frequency) window 104 formed of alumina is provided at an upper portion of the chamber 100, and coils 105 are placed over the RF window 104.

A first high-frequency power supply 106, for supplying a high-frequency plasma-generating electric power, is connected to the coils 105. A frequency of this first high-frequency power supply 106 is not particularly limited, but in this embodiment it is 13.56 MHz.

Additionally, a second high-frequency power supply 107 is connected to the electrostatic chuck 103, for the purpose of supplying a high-frequency bias electric power. A frequency of this second high frequency power supply 107 is 4 MHz, which is lower than that of the first high-frequency power supply 106.

In this HDPCVD chamber 100, normally, the film deposition is carried out by applying the high-frequency bias electric power to a film deposition atmosphere by turning on not only the first high-frequency power supply 106 but also the second high-frequency power supply 107.

Next, a method of manufacturing a semiconductor device by using this HDPCVD chamber will be described.

Figure 3A:
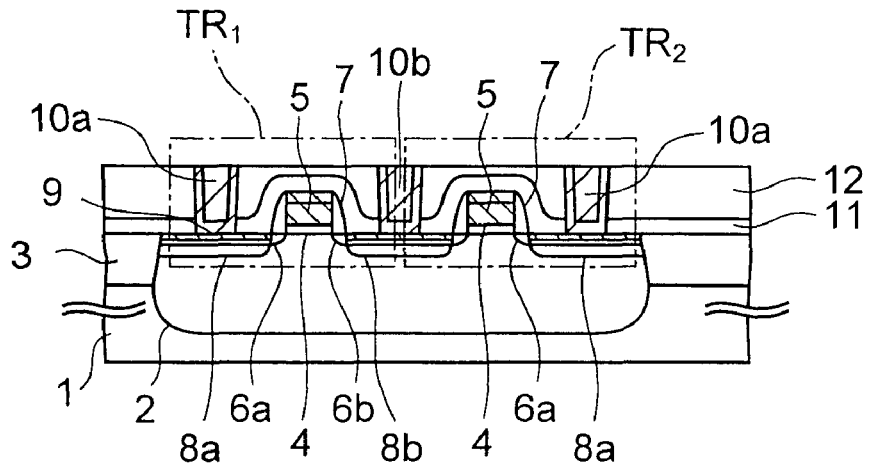
FIGS. 3A to 3Z and FIG. 4 are cross-sectional views of a semiconductor device in progress of manufacturing processes during a first embodiment of the present invention.
Figure 3B:
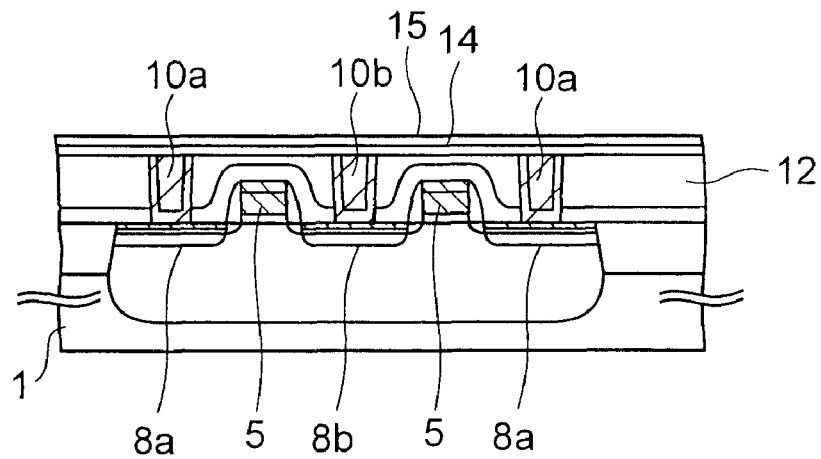
Figure 3C:
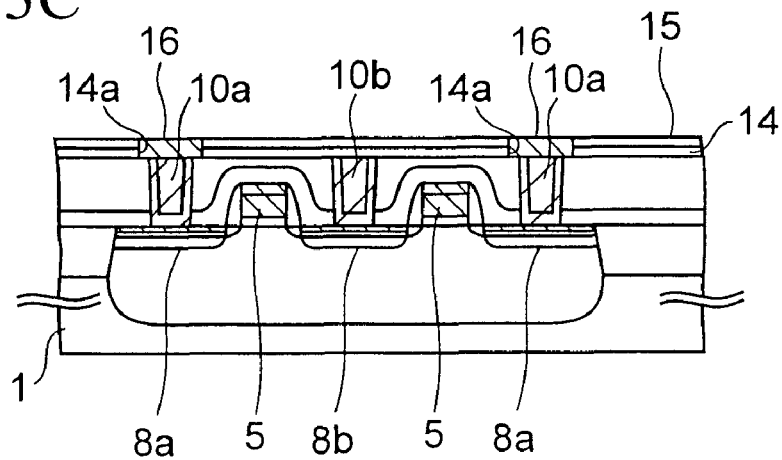
Figure 3D:
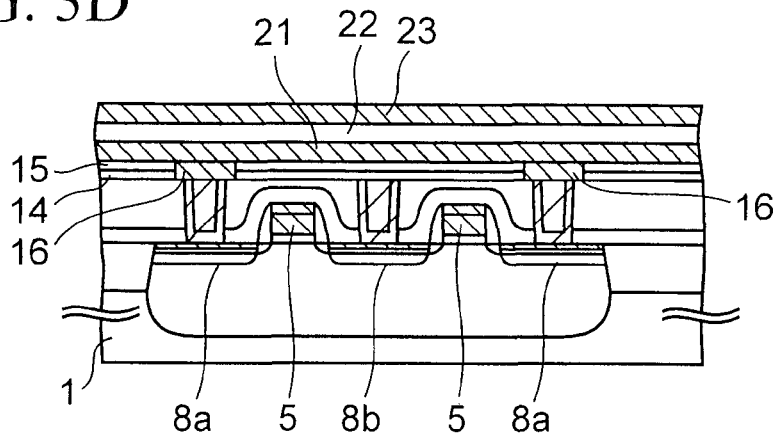
Figure 3E:
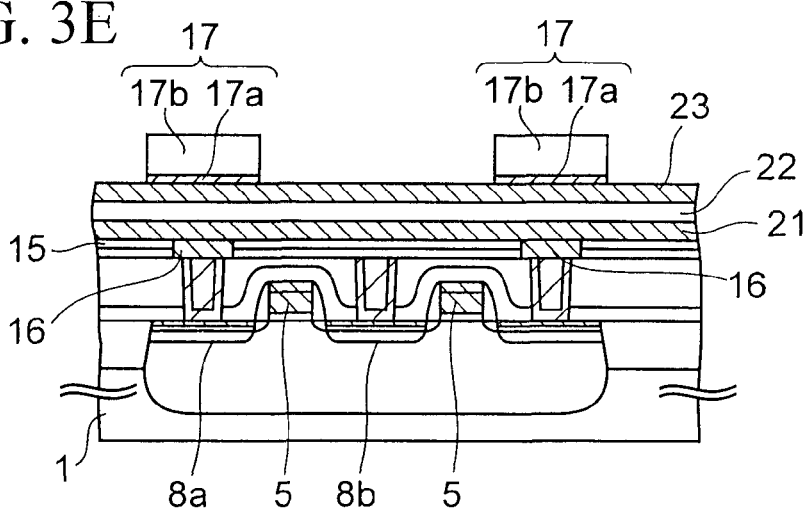
Figure 3F:
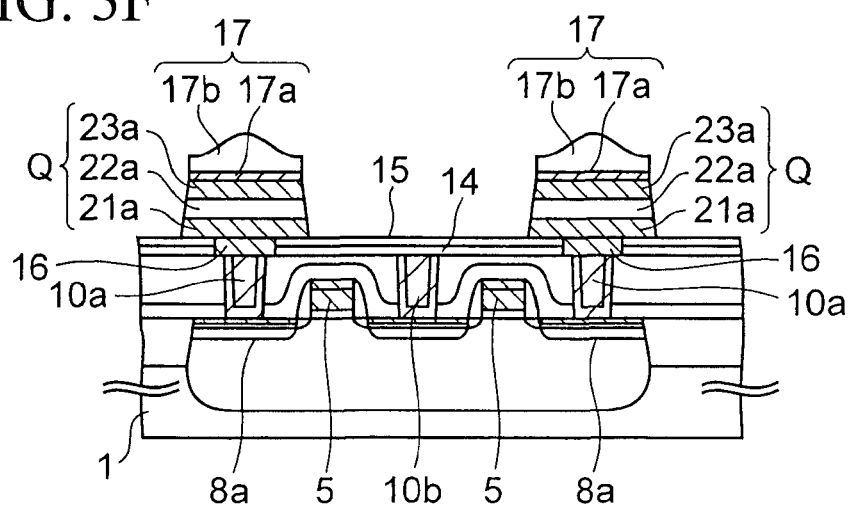
Figure 3G:
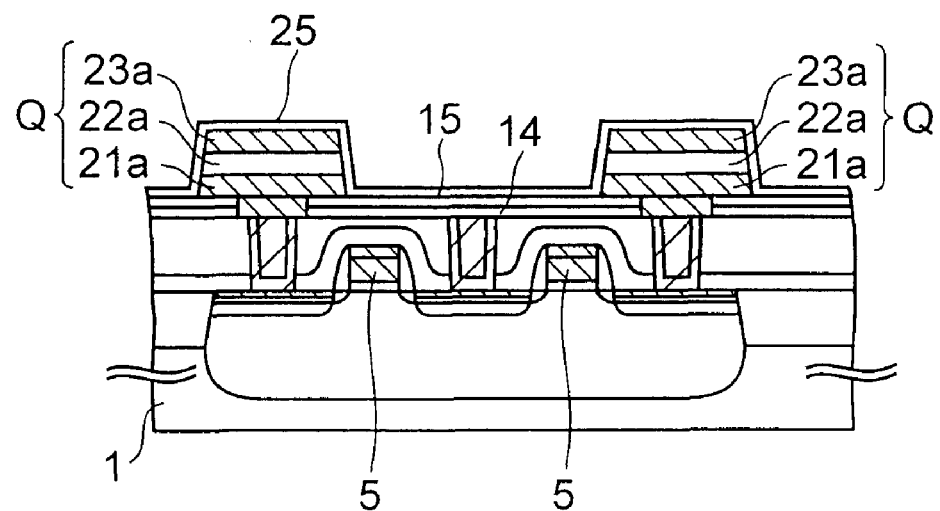
Figure 3H:
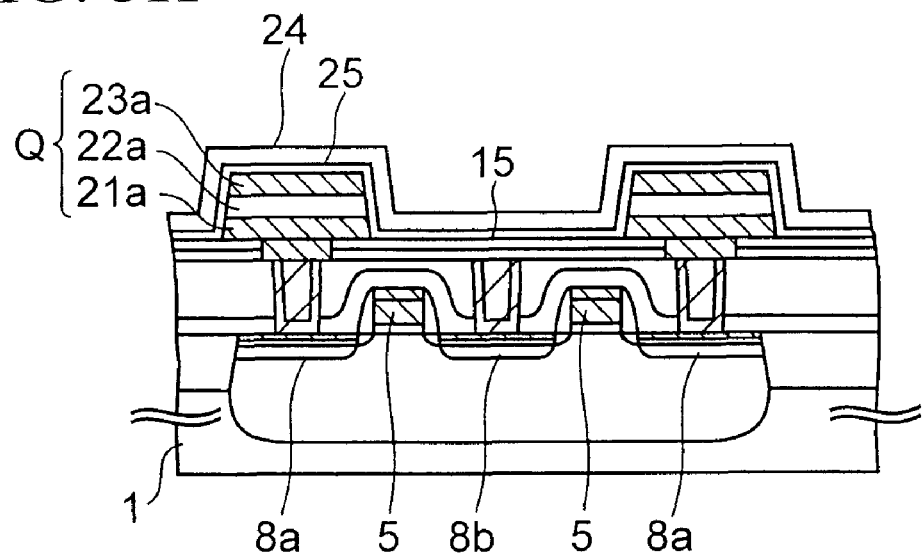
Figure 3I:
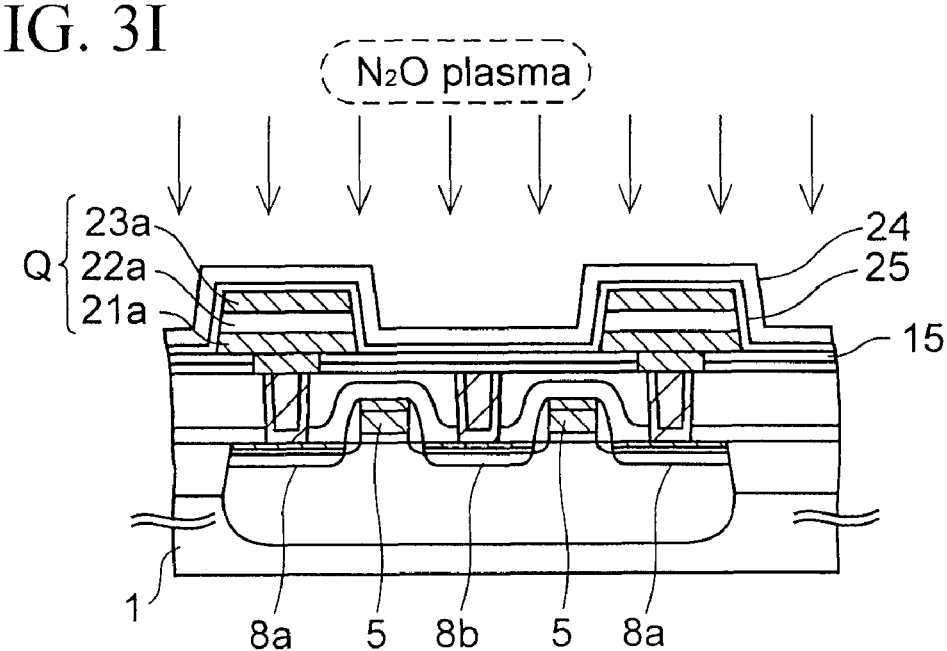
Figure 3J:
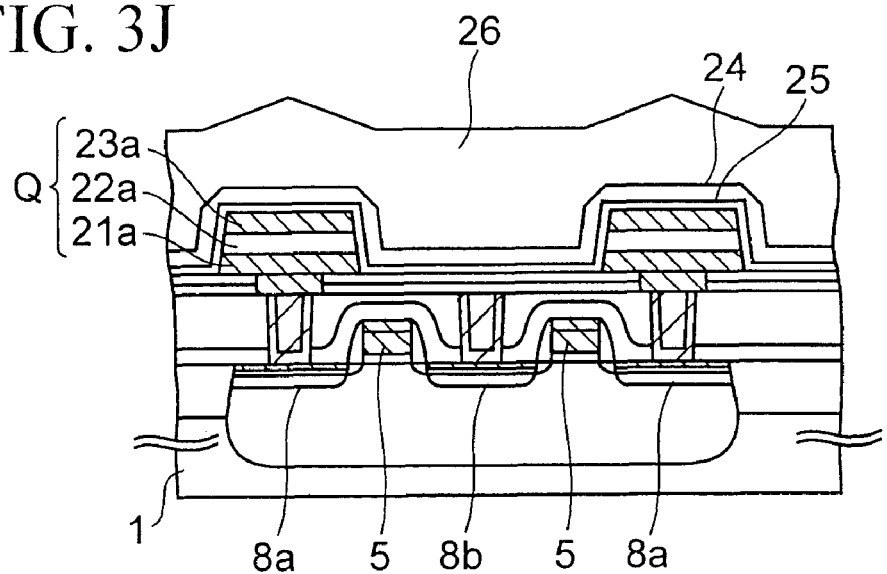
Figure 3K:
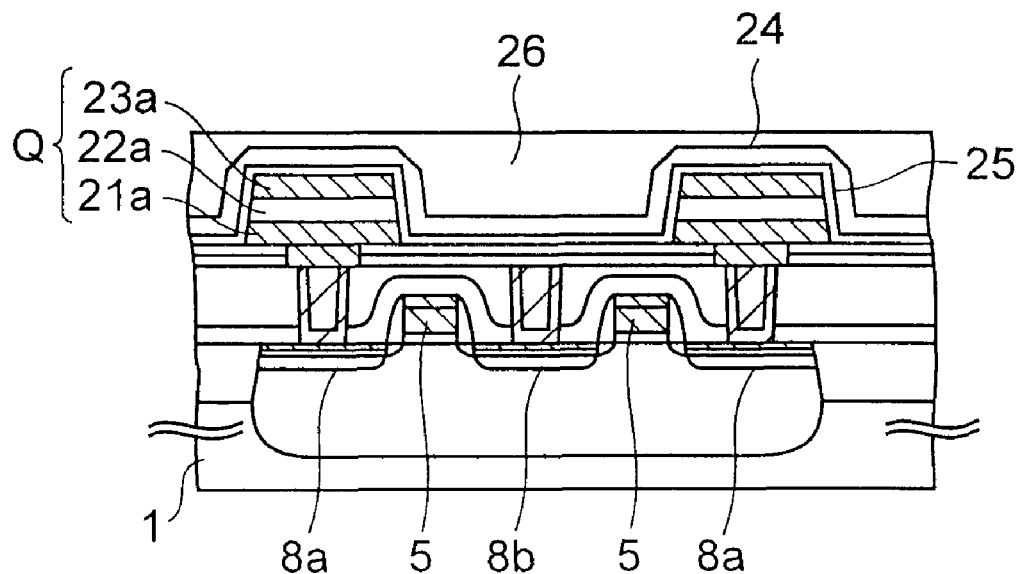
Figure 3L:
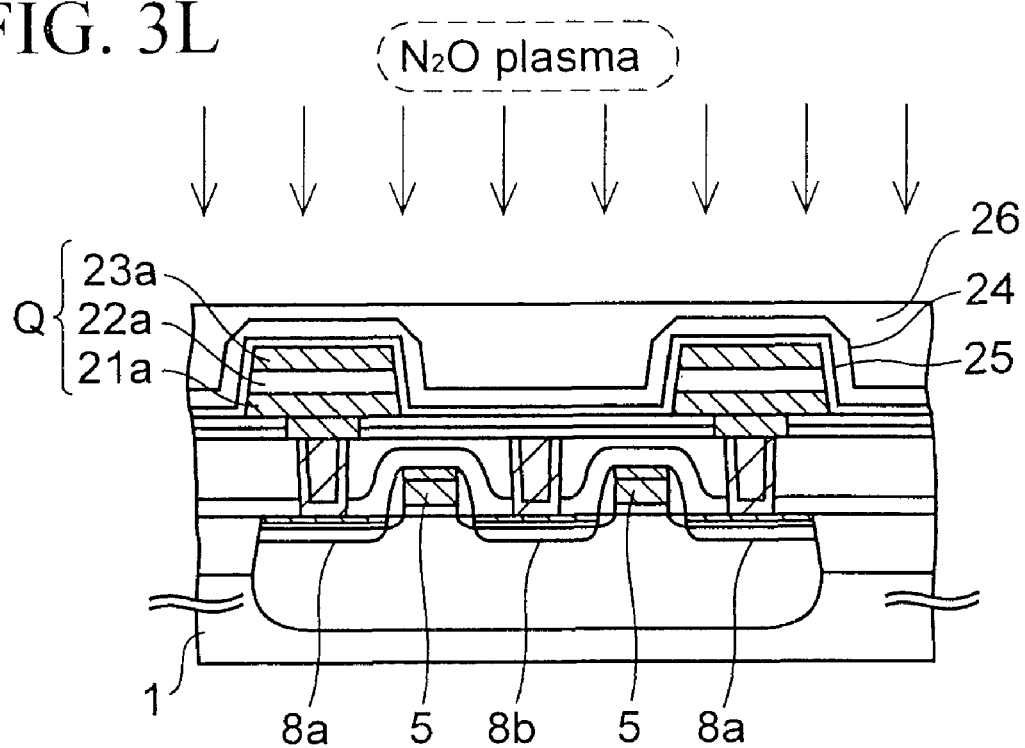
Figure 3M:
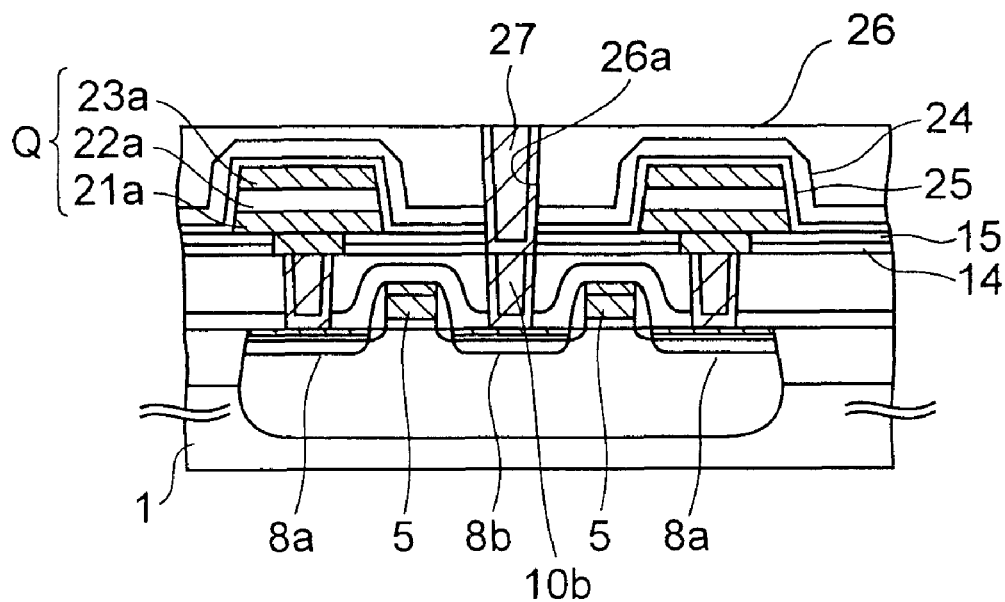
Figure 3N:
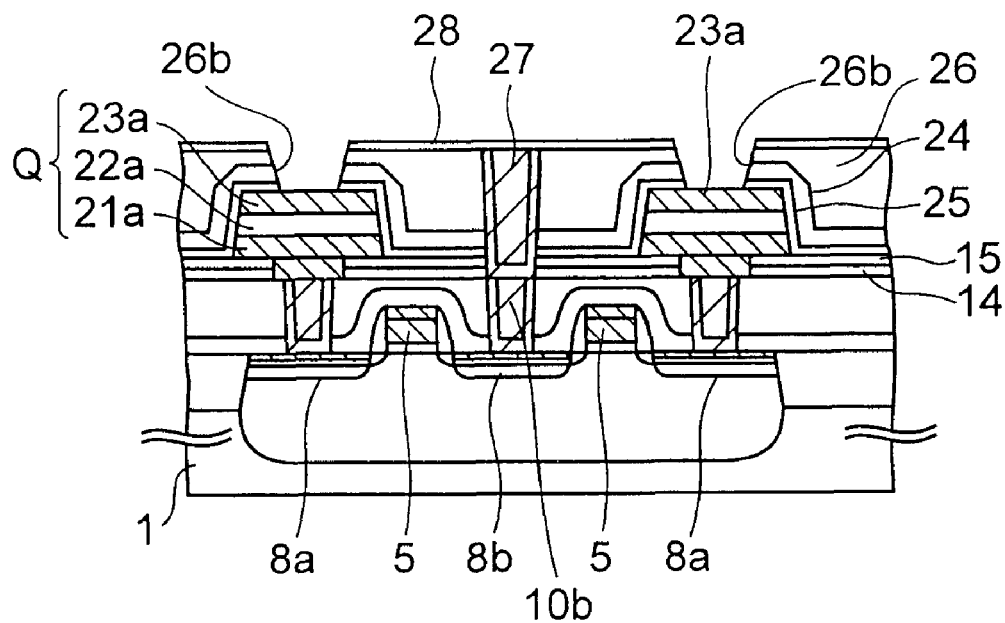
Figure 3O:
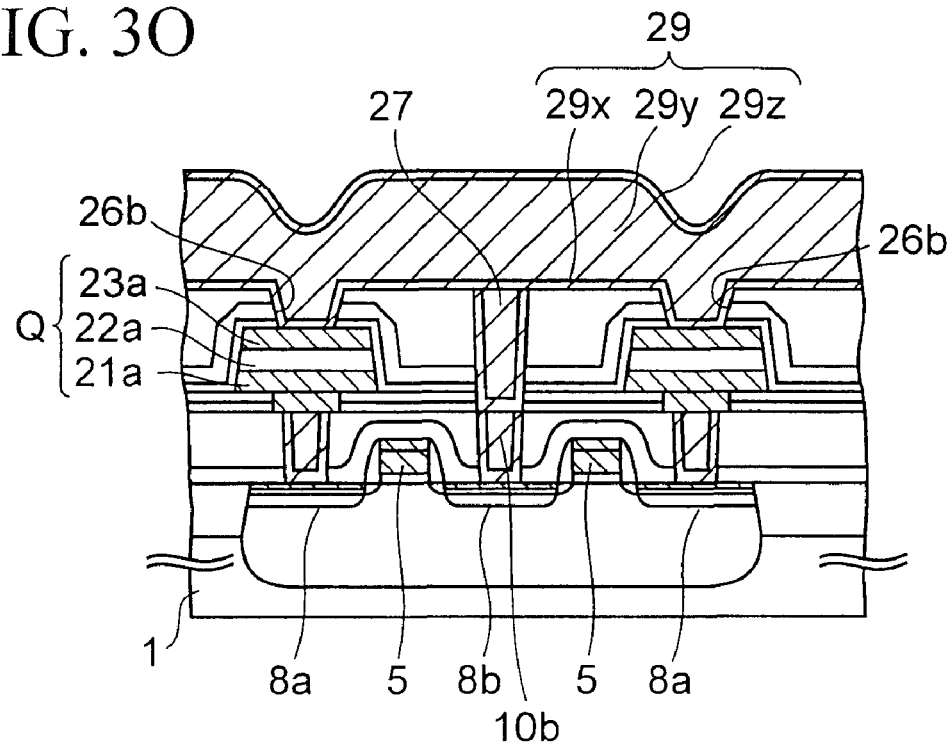
Figure 3P:
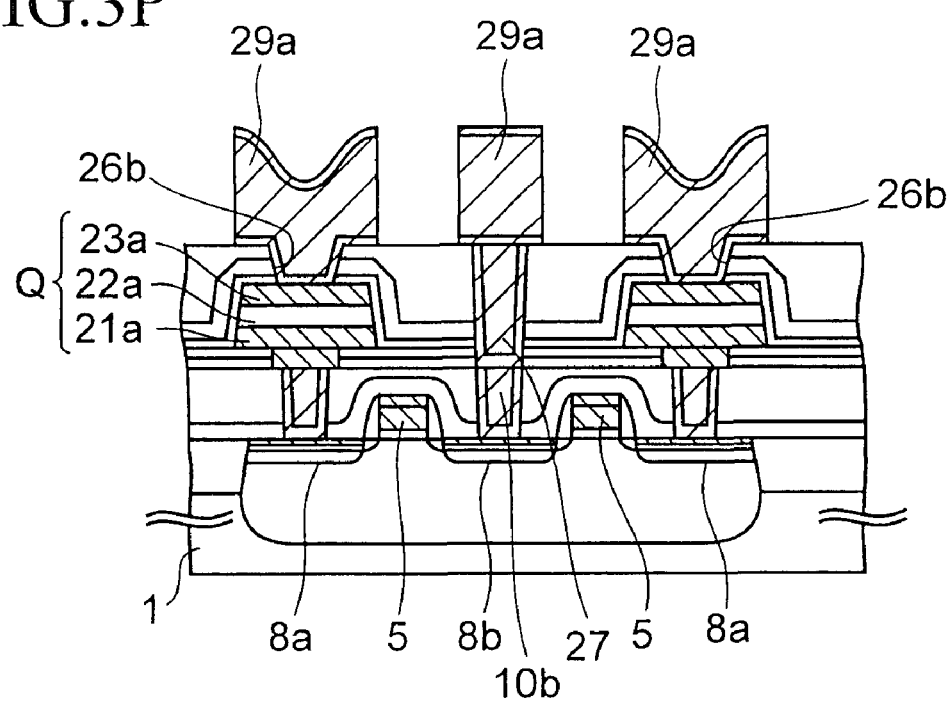
Figure 3Q:
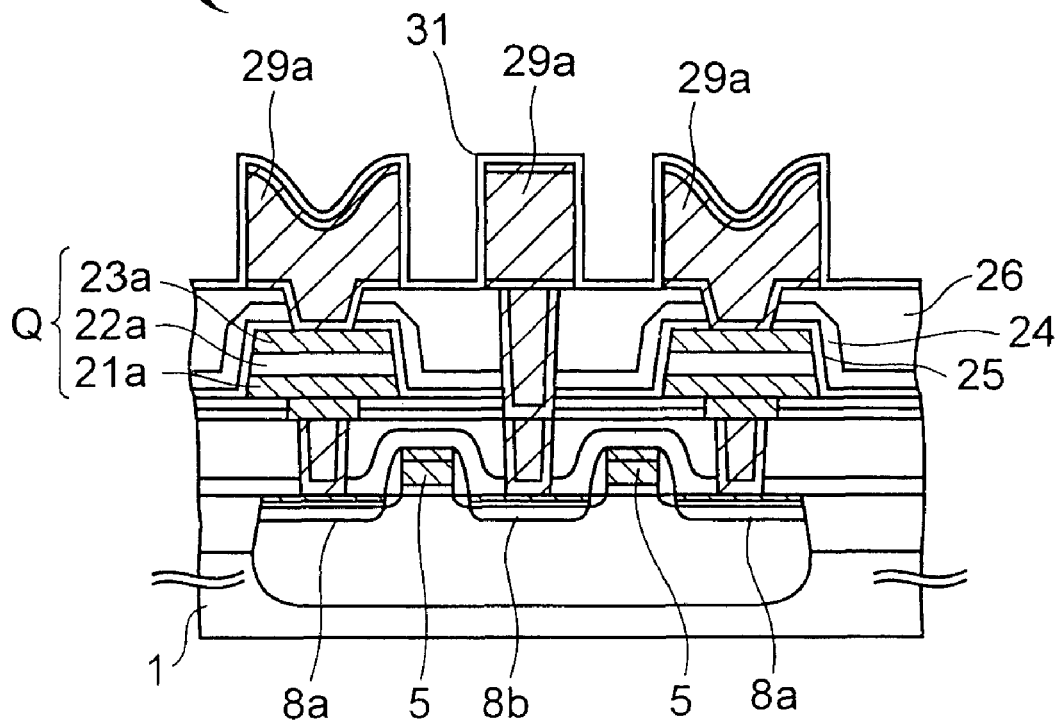
Figure 3R:
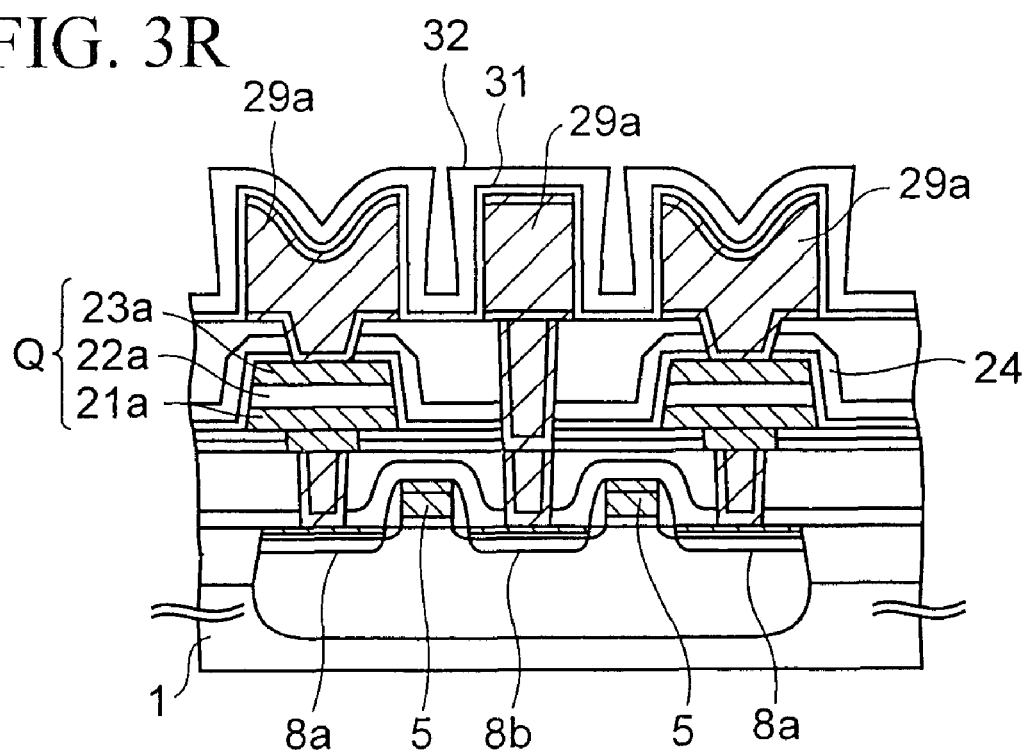
Figure 3S:
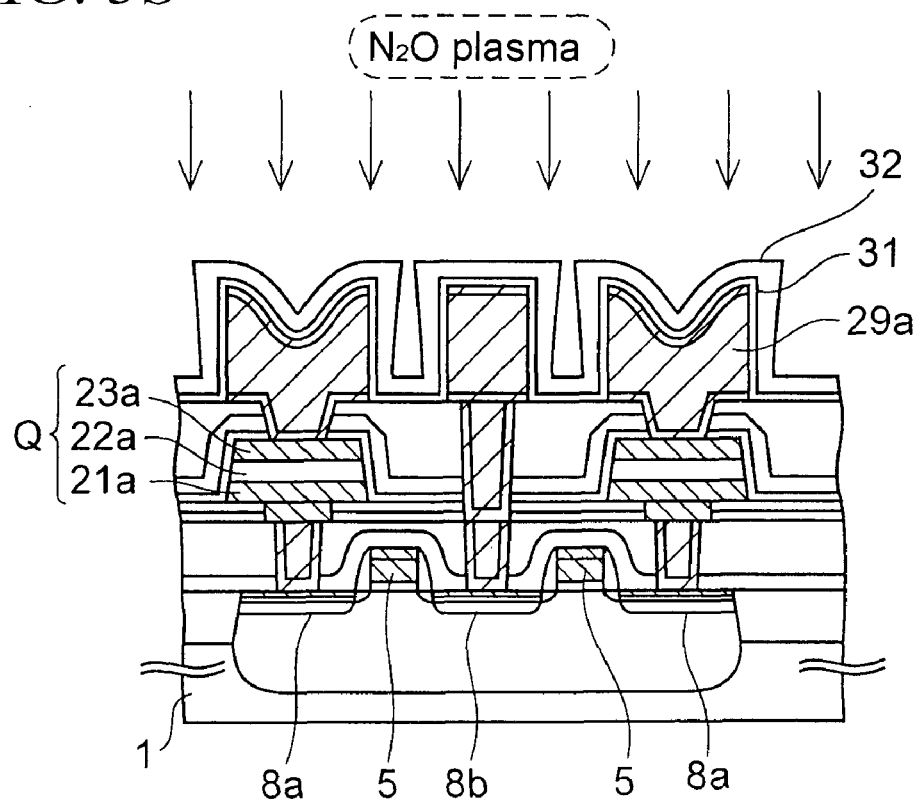
Figure 3T:
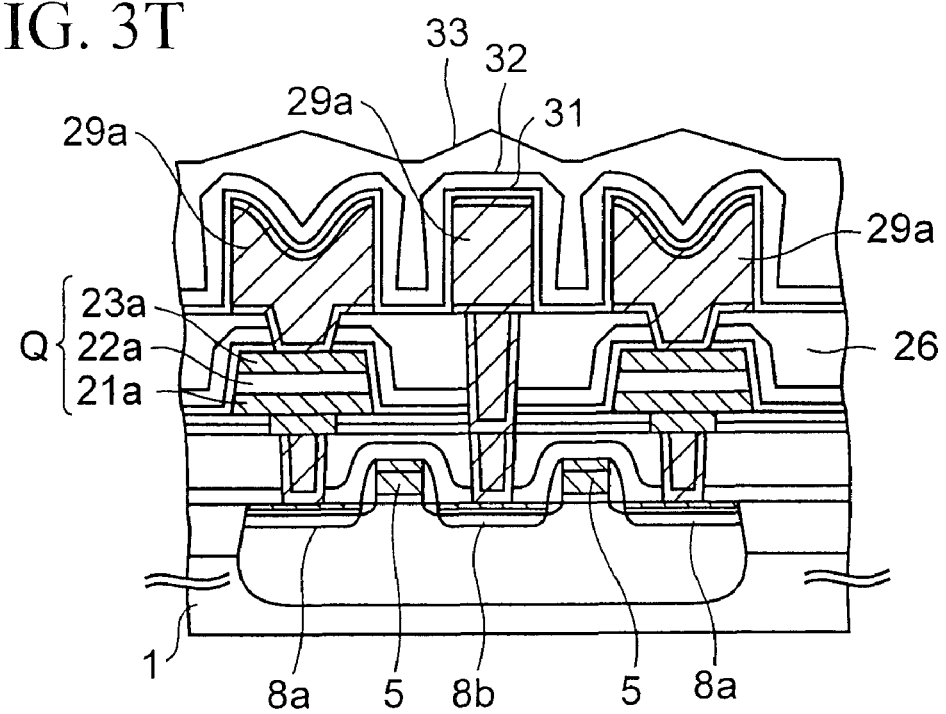
Figure 3U:
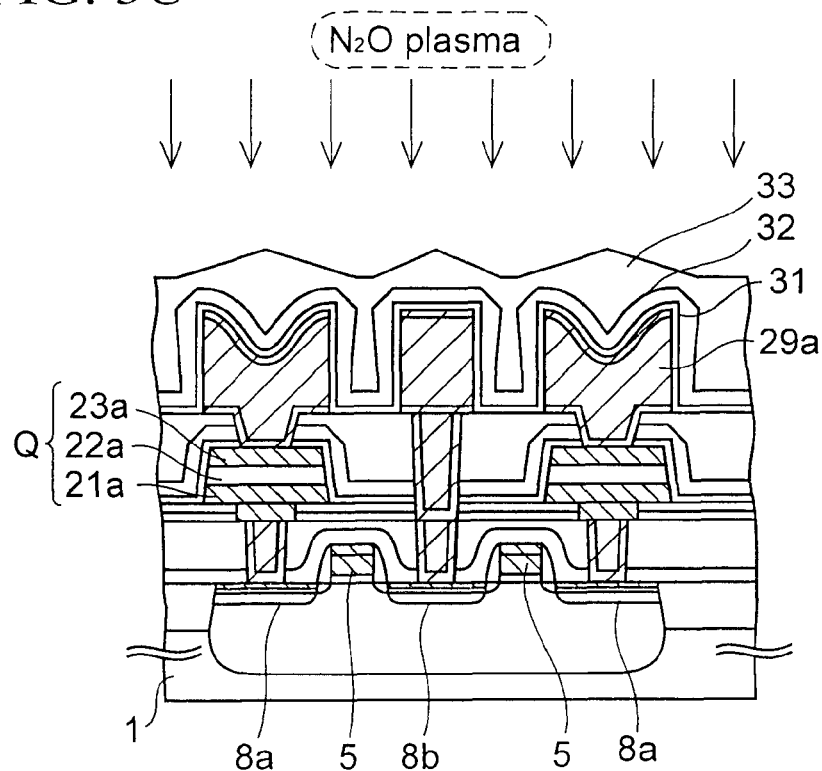
Figure 3V:
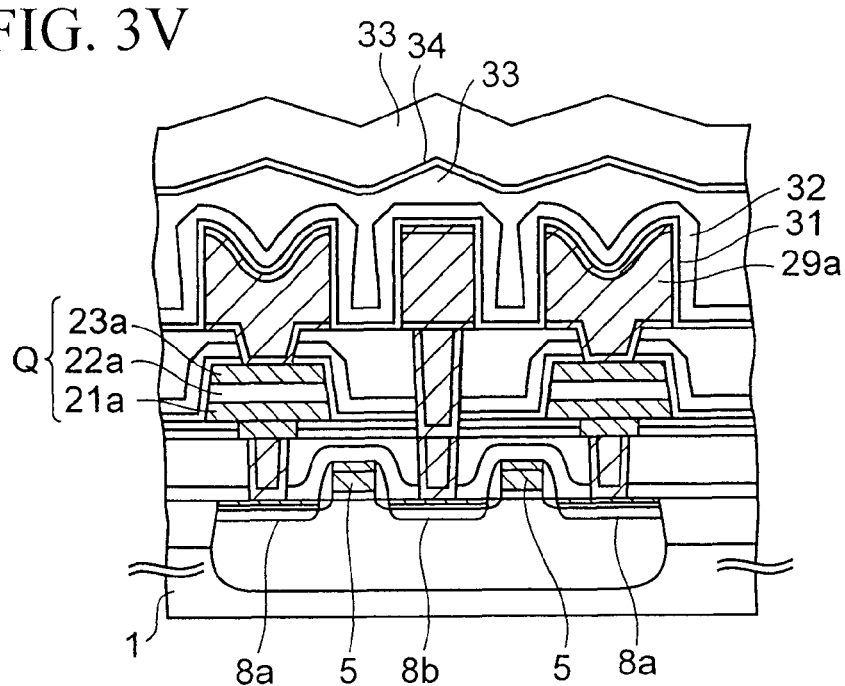
Figure 3W:
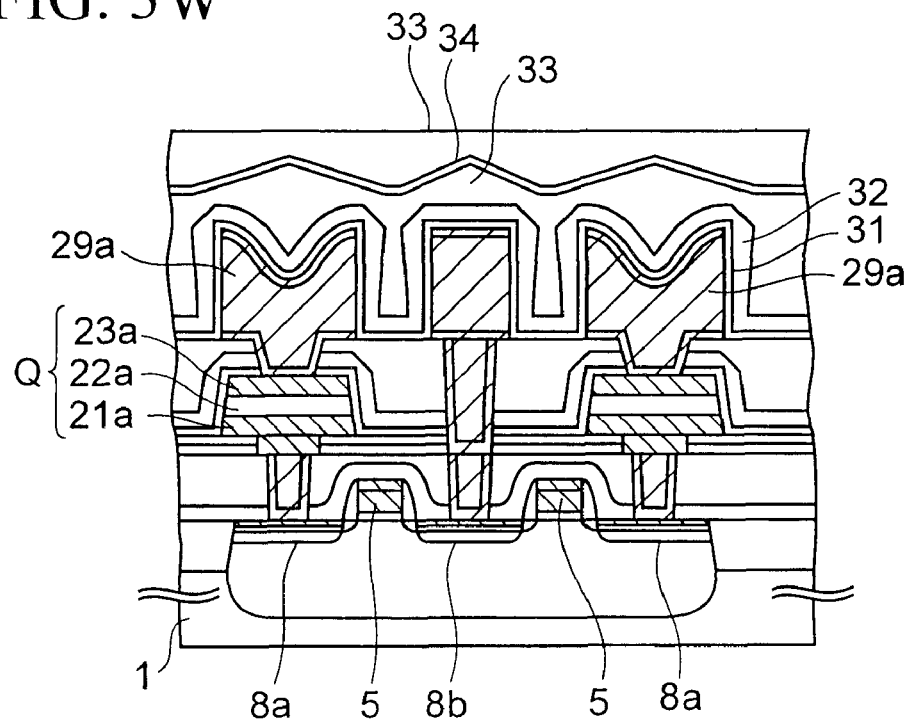
Figure 3X:
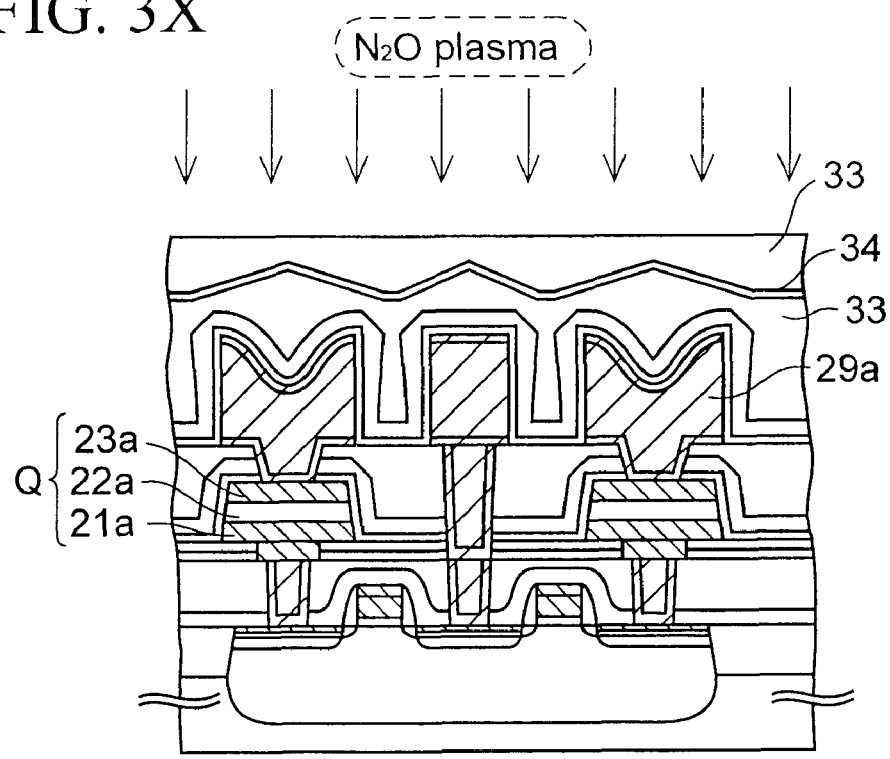
Figure 3Y:
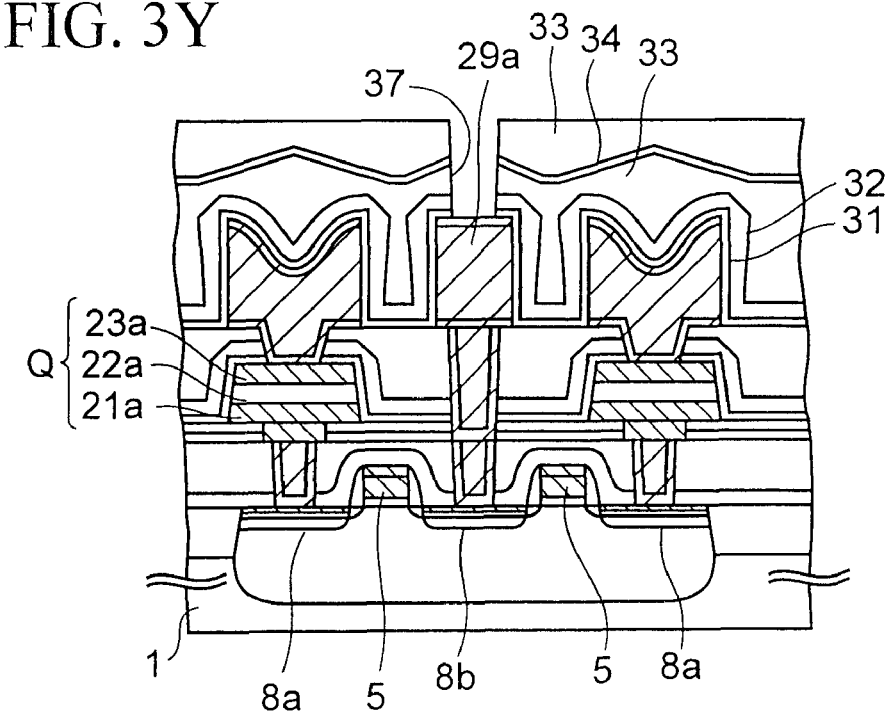
Figure 3Z:
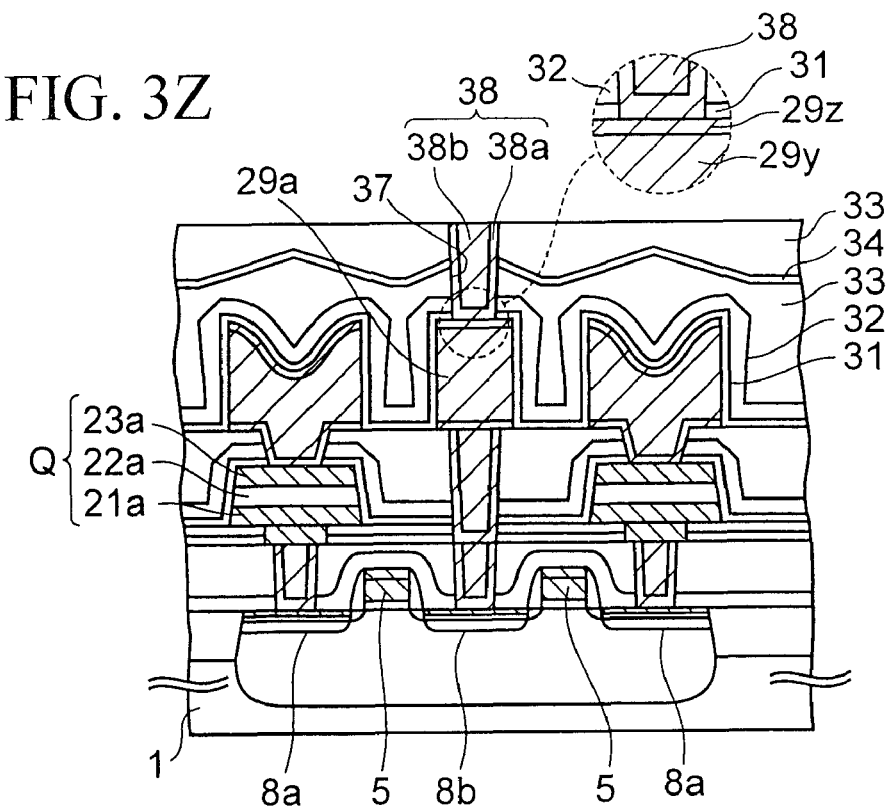
Figure 4:
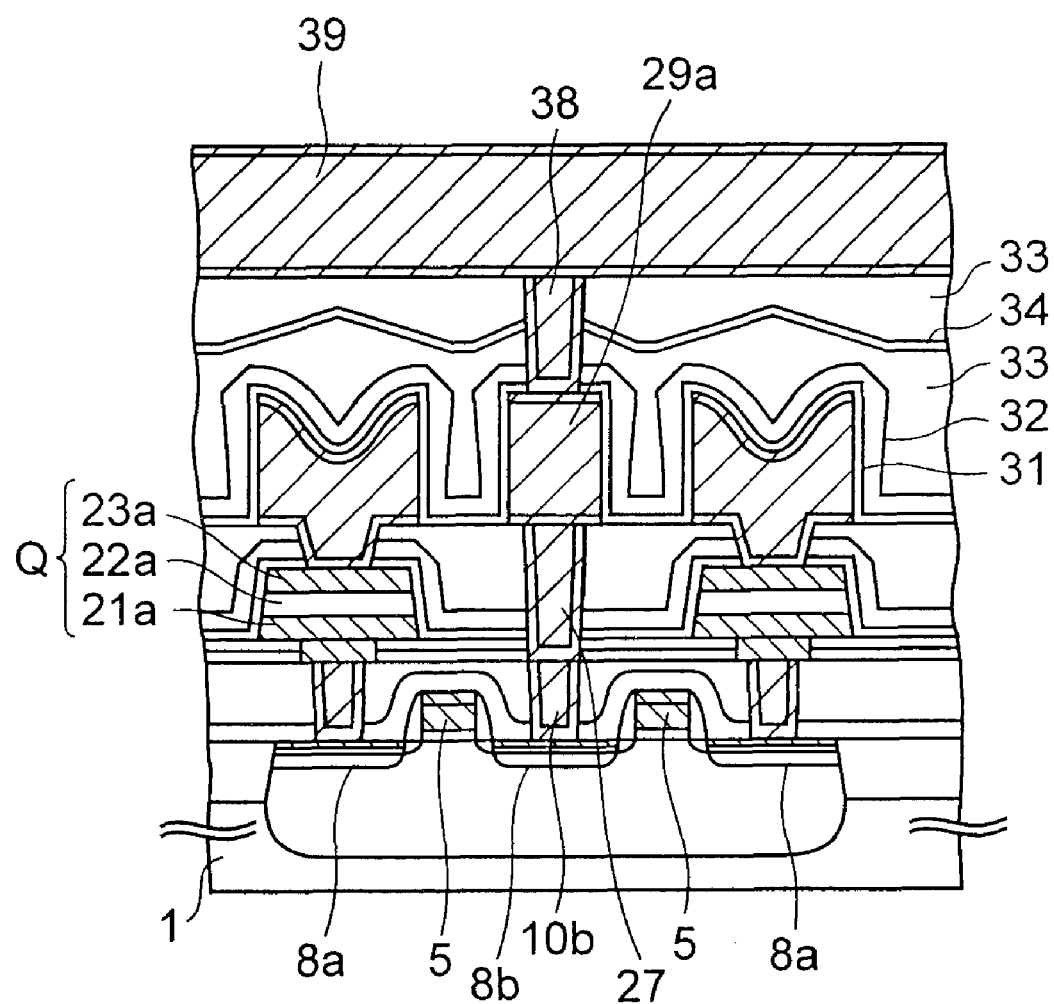

FIGS. 3A to 3Z and FIG. 4 are cross-sectional views of a semiconductor device in progress of manufacturing processes in a first embodiment of the present invention.

This semiconductor device is called as a stacked FeRAM, in which a conductive plug is formed directly underneath a ferroelectric capacitor, and is advantageous for miniaturization.

Firstly, processes performed until a cross-sectional structure shown in FIG. 3A is obtained will be described.

First, a trench of shallow trench isolation (STI) defining active regions of transistors is formed in a surface of the n-type or p-type silicon (semiconductor) substrate 1, and then an insulating film formed of silicon oxide or the like is buried in the trench as a device isolation insulating film 3. Note that a device isolation structure is not limited to STI, and the device isolation insulating film 3 may be formed by a LOCOS (Local Oxidation of Silicon) method.

Next, after a p-well 2 is formed by introducing a p-type impurity in an active region of the silicon substrate 1, a thermal oxide film is formed as a gate insulating film 4 by thermally oxidizing a surface of that active region.

Thereafter, after an amorphous or polycrystalline silicon film and a tungsten silicide film are sequentially formed on an entire upper side of the silicon substrate 1, two gate electrodes 5 are formed by patterning these films by a photolithography.

On the p-well 2, two gate electrodes 5 are arranged in almost parallel with each other with a space interposed therebetween, and the gate electrodes 5 constitute a part of a word line.

Then, by ion implantation using the gate electrodes 5 as masks, an n-type impurity is introduced into the silicon substrate 1 beside the gate electrodes 5, and thereby first source/drain extensions 6a, and a second source/drain extension 6b are formed.

Subsequently, an insulting film is formed over an entire upper surface of the silicon substrate 1, and the insulting film is etched back to be left as insulating sidewalls 7 beside the gate electrodes 5. As the insulating film, for example, a silicon oxide film is formed by the CVD method.

Thereafter, by implanting ions of an n-type impurity into the silicon substrate 1 again by using the insulating sidewalls 7 and the gate electrodes 5 as masks, a first source/drain regions 8a and a second source/drain region 8b, which are arranged at a distance from each other, are formed in the silicon substrate 1 beside the gate electrodes 5.

The processes until this point result in formation of a first MOS transistor $TR_1$ and a second MOS transistor $TR_2$ in the active region of the silicon substrate 1, and the first and second MOS transistors $TR_1$ and $TR_2$ are composed of the gate insulating films 4, the gate electrodes 5, and the first and second source/drain regions 8a and 8b.

Then, after a refractory metal layer such as a cobalt layer or the like is formed on the entire upper surface of the silicon substrate 1 by a sputtering method, the refractory metal layer is heated to be reacted with silicon. Thereby, a refractory metal silicide layer 9 is formed on the silicon substrate 1. The refractory metal silicide layer 9 is also formed on surfaces of the gate electrodes 5, so that the electrical resistance of the gate electrodes 5 is reduced.

Subsequently, the unreacted refractory metal layer remaining on the device isolation insulating film 3 and the like is wet-etched to be removed.

Afterward, a silicon oxynitride (SiON) film is formed to an about 200 nm thickness by a plasma CVD method, and this SiON film is used as a cover insulating film 11. Then, a silicon oxide film is formed to an about 1.0 μm thickness as a base insulating film 12 on the cover insulating film 11 by the plasma CVD method using TEOS (tetraethoxysilane) gas.

Then, the base insulating film 12 is heated with a substrate temperature at 700° C. for 30 minutes in a nitrogen atmosphere under a normal pressure, whereby the base insulating film 12 is densified. Thereafter, an upper surface of the insulating film 12 is polished to be planarized by a CMP (chemical mechanical polishing) method.

Next, the cover insulating film 11 and the base insulating film 12 are patterned by a photolithography to form contact holes over the first source/drain region 8a and the second source/drain region 8b. Thereafter, a conductive film is formed on inner surfaces of the contact holes and on the upper surface of the base insulating film 12. The conductive film is then polished by a CMP method to be left in the abovementioned contact holes as first conductive plugs 10a and a second conductive plug 10b. The conductive film is, for example, a laminated film composed of a glue film formed by the sputtering method and a tungsten film formed by the CVD method. Additionally, a film, which is formed by laminating a titanium film of about 20 nm thick and a titanium nitride film of about 50 nm thick in this order, is used as the glue film.

Note that, out of the abovementioned plugs 10a and 10b, the second conductive plug 10b composes a part of a bit line together with the second source/drain region 8b.

Next, as shown in FIG. 3B, a silicon oxynitride film is formed to a thickness of about 100 nm by the CVD method as an oxidation preventing insulating film 14 on upper surfaces of the conductive plugs 10a and 10b and the base insulating film 12. The second conductive plug 10b is mainly composed of tungsten which can be easily oxidized by oxygen. Nevertheless, by covering the upper surface of the plug 10b with the oxidation preventing insulating film 14, it becomes possible to prevent the second conductive plug 10b from being oxidized and causing a contact failure even when the second conductive plug 10b is annealed in an oxygen atmosphere.

Then, a silicon oxide film is formed to an about 100 nm thickness by the plasma CVD method using TOES gas on the oxidation preventing insulating film 14, and this silicon oxide film is used as an insulating adhesive film 15. The insulating adhesive film 15 plays a role of enhancing adhesion strength with a lower electrode of a capacitor which will be described later.

Next, processes until a cross-sectional structure shown in FIG. 3C is obtained will be described.

First, by patterning the oxidation preventing insulating film 14 and the insulating adhesive film 15 through the photolithography, opening 14a are formed in these films on the first conductive plugs 10a.

Then, an iridium layer having a sufficient thickness for completely filling the opening 14a, for example 400 nm thick, is formed on the insulating adhesive film 15 and in the opening 14a by the sputtering method. This iridium layer is used as an oxygen barrier metal film 16. Thereafter, an excess oxygen barrier metal film 16 on the insulating adhesive film 15 is polished to be removed by the CMP method, whereby the oxygen barrier metal film 16 is left only in the opening 14a in the form of island.

Since the oxygen barrier metal film 16 formed of iridium has an excellent capability of preventing oxygen transmission, it becomes difficult to oxidize the first conductive plugs 10a under the oxygen barrier metal film 16, even when annealing is applied to the plugs 10a in an oxygen atmosphere.

Next, processes until a cross-sectional structure shown in FIG. 3D is obtained will be described.

First, an iridium film is formed to an about 150 nm thickness on the insulating adhesive film 15 and on the oxygen barrier metal film 16 by a DC sputtering method. This iridium film is used as a first conductive film 21.

Then, a PZT ($Pb(Zr_xTi_{1-x})O_3$ (where $0\square \ldots x\square \ldots 1$)) film is formed to an about 120 nm thickness on the first conductive film 21 by an MOCVD (Metal Organic CVD) method, and this PZT film is used as a ferroelectric film 22.

A film deposition condition in the abovementioned MOCVD method is not limited. In this embodiment, $Pb(thd)_2$, $Zr(DMHD)_4$ and $Ti(O-iPr)_2(thd)_2$ are used as materials for PZT, and these materials are vaporized in the vaporizer. After that, vaporized materials are mixed with oxygen, and the gas mixture is splayed to the silicon substrate 1, so that the ferroelectric film 22 is formed.

Note that there are also the sputtering method and a sol-gel method as film deposition methods of the ferroelectric film 22. Furthermore, materials for the ferroelectric film 22 are not limited to the abovementioned PZT. The ferroelectric film 22 may be formed of: a Bi-layer structure compound such as $SrBi_2Ta_2O_9$, $SrBi_2(Ta, Nb)_2O_9$ or the like; PLZT obtained by doping PZT with lanthanum; or another metal oxide ferroelectric materials.

Subsequently, an iridium oxide film is formed to a thickness of about 200 nm on the ferroelectric film 22 by the sputtering method, and this iridium oxide film is used as a second conductive film 23. Note that, instead of the iridium oxide film, a platinum film may be formed as the second conductive film 23.

Next, as shown in FIG. 3E, hard masks 17 composed of titanium nitride film 17a and a silicon oxide film 17b are formed on the second conductive film 23.

Furthermore, as shown in FIG. 3F, while the hard masks 17 are used as etching masks, capacitors Q are formed by collectively plasma etching the second conductive film 23, the ferroelectric film 22 and the first conductive film 21 through sputtering reactions in an atmosphere containing halogen elements. Thus, the capacitors Q, which are made by laminating a lower electrode 21a, a capacitor dielectric film 22a, and an upper electrode 23a in this order, are formed.

Thereafter, the hard masks 17 are removed.

The lower electrodes 21a of the capacitors Q are electrically connected to the first source/drain regions 8a through the oxygen barrier metal film 16 and the first conductive plug 10a. Additionally, the insulating adhesive film 15, which is formed of silicon oxide, functions as an etching stopper in etching when the capacitor Q is patterned, and thereby, the second conductive plug 10b remain being protected by the insulating adhesive film 15 and the oxidation preventing insulating film 14.

Subsequently, for the purpose of recovering the capacitor dielectric film 22a damaged in the abovementioned plasma etching, annealing is performed for the capacitor dielectric film 22a in an oxygen-containing furnace under a condition of a substrate temperature at 650° C., and a process time of 60 minutes. Annealing of this kind is also called as a recover-annealing.

During this recover-annealing, the second conductive plug 10b composing a bit line can be prevented from being oxidized by the oxidation preventing insulating film 14 on the plug 10b. On the other hand, the first conductive plugs 10a directly underneath the capacitors Q can be prevented from being oxidized by the oxygen barrier metal films 16.

Next, as shown in FIG. 3G, an alumina ($Al_2O_3$) film is formed to a thickness of about 50 nm on the capacitors Q by the MOCVD method, and this alumina film is used as a first hydrogen diffusion preventing insulating film 25. The first hydrogen diffusion preventing insulating film 25 is served to protect the capacitors Q against a reducing atmosphere such as hydrogen or the like. The first hydrogen diffusion preventing insulating film 25 is not limited to the alumina film, but may be any one of an aluminum nitride film, a tantalum oxide film, a tantalum nitride film, a titanium oxide film, and a zirconium oxide film.

The first hydrogen diffusion preventing insulating film 25 formed by the MOCVD method is more excellent in coverage characteristics than a film formed by the sputtering method, and has a sufficient thickness on side surfaces of the capacitor dielectric films 22a. Therefore, the first hydrogen diffusion preventing insulating film 25 is capable of effectively blocking intrusion of reductant such as hydrogen into the capacitor dielectric films 22a from the side surfaces thereof.

Thereafter, as recover-annealing for the capacitors Q, annealing is performed in a furnace for about 20 minutes under a condition of a substrate temperature of 650° C.

Next, as shown in FIG. 3H, a silicon oxide film is formed to a thickness of about 50 nm as a capacitor protecting insulating film 24 by using a gas mixture of $SiH_4$ gas (silicon compound gas), $O_2$ and argon as a film deposition gas on the first hydrogen diffusion preventing insulation film 25 in the HDPCVD chamber 100 described in FIG. 2.

Here, when this capacitor protecting insulating film 24 is deposited, an atmosphere in the HDPCVD chamber 100 is made into plasma by turning on the first high-frequency power supply 106 (see FIG. 2) while turning-off the second high-frequency power supply 107 for supplying a high-frequency bias electric power. As a result, ions and oxygen radicals are not drawn toward the semiconductor substrate 1 in the film deposition atmosphere by the high-frequency bias electric power, so that the first hydrogen diffusion preventing insulating film 25 can be prevented from being scraped off by collision of the ions and the like.

As the deposition condition for the capacitor protecting insulating film 24, present embodiment employs such a condition in which a moisture content in the film 24 can be reduced, which will be described later in detail.

Next, as shown in FIG. 3I, in order to further reduce moisture content of the capacitor protecting insulating film 24, the capacitor protecting insulating film 24 is dehydrated by exposing its surface to nitrogen-containing plasma such as $N_2O$ plasma. Although a condition for this $N_2O$ plasma treatment is not particularly limited, a substrate temperature is set between about 200 and 450° C. and a process time is set 4 minutes in the present embodiment.

Note that, instead of the $N_2O$ plasma treatment, an $N_2$ plasma treatment may be employed as the dehydration process. This is also the case for the dehydration processes described later.

Furthermore, this dehydration treatment is optional. If moisture content of the capacitor protecting insulating film 24 is sufficiently low, there is no need to carry out the dehydration treatment.

Next, as shown in FIG. 3J, a silicon oxide film is formed as a first insulating film 26 on the capacitor protecting insulating film 24 in the HDPCVD chamber 100 described in FIG. 2. This first insulating film 26 is thick enough to fill a space between the adjacent capacitors Q, which is, for example, about 700 nm on a planar surface of the silicon substrate 1.

When the above-described capacitor protecting insulating film 24 is formed, the second high-frequency power supply 107 for bias application, which is connected to the HDPCVD chamber 100 (refer to FIG. 2), is turned off.

On the other hand, when the first insulating film 26 is formed, a high-frequency bias electric power is applied to a film deposition atmosphere by turning on not only the first high-frequency power supply 106 but also the second high-frequency power supply 107. As a result, at the time of forming the first insulating film 26, ions and oxygen radicals are drawn toward the semiconductor substrate 1 due to the high-frequency bias electric power, and thus sputter-etching by these ions simultaneously progresses. By this sputter-etching, the first insulating film 26 can be prevented from being formed in an overhanging state in the vicinities of shoulder of the capacitors Q. Therefore, the first insulating film 26 can be formed, while a void is prevented from generating in the space between the adjacent capacitors Q.

Additionally, the capacitor protecting insulating film 24 is formed under the first insulating film 26 in advance, it is made possible to prevent the first hydrogen preventing insulating film 25 from being etched due to the sputter-etching in an initial phase of a deposition process of the first insulating film 26. Thereby, a hydrogen blocking effect of the first hydrogen preventing insulating film 25 can be well maintained.

Note that, although a film deposition condition of the first insulating film 26 is not particularly limited, a gas mixture containing $SiH_4$ gas, $O_2$ and argon is used as a film deposition gas in the present embodiment. Additionally, as to the flow rates of these gases, $SiH_4$ gas, $O_2$ and argon are set to 70 sccm, 525 accm and 420 sccm, respectively. Moreover, a power of the first high-frequency power supply 106 for plasma generation is set to 2400 W, and a power of the second high-frequency power supply 107 for bias application is set to 3500 W. Furthermore, a pressure of a film deposition atmosphere in the chamber is set to about 15 mTorr, and a substrate temperature is set between about 175° C. and 400° C.

Additionally, in the case where the $N_2O$ plasma treatment described in FIG. 3I is omitted, the capacitor protecting insulating film 24 and the first insulating film 26 are continuously deposited in the chamber 100 shown in FIG. 2, whereby manufacturing process may be shortened as compared to the case where these films are deposited one by one in different chambers.

Next, as shown in FIG. 3K, an upper surface of the first insulating film 26 is planarized by polishing in a CMP (Chemical Mechanical Polishing) method, so that a thickness of the first insulating film 26 on the upper electrodes 23a is set to about 200 nm.

Then, as shown in FIG. 3L, the $N_2O$ plasma treatment is performed to the first insulating film 26, so that the film 26 is dehydrated. A condition for this $N_2O$ plasma treatment is, for example, a substrate temperature of about 200° C. to 450° C. and a process time of about 4 minutes.

Note that, when moisture content of the first insulating film 26 is sufficiently low, this dehydration process may be omitted.

Subsequently, as shown in FIG. 3M, by etching the films from the first insulating film 26 to the oxidation preventing insulating film 14 through a photolithography, a first hole 26a is formed in these films. Then, on an inner surface of the first hole 26a and an upper surface of the first insulating film 26, a titanium film and a titanium nitride film are formed in this order with about 50 nm thickness as a glue film by the sputtering method. Furthermore, a tungsten film is formed on this glue film by the CVD method, and this tungsten film completely fills in the first hole 26. Thereafter, excess portions of the tungsten film and the glue film on the first insulating film 26 are polished to be removed, so that these films are left in the first hole 26a as a third conductive plug 27.

Next, as shown in FIG. 3N, a silicon oxynitride film is formed to a thickness of about 100 nm by a CVD method as an oxidation preventing film 28 on each upper surface of the third conductive plug 27 and the first insulating film 26.

Then, by pattering the films from the oxidation preventing film 28 to the first hydrogen diffusion preventing insulating film 15 through a photolithography, second holes 26b are formed in the first insulating film 26 on the upper electrodes 23a. The capacitors Q damaged by the formation of the second holes 26b is recovered through annealing. The annealing is carried out, for example, in an oxygen-containing atmosphere for about 60 minutes by setting a substrate temperature at 550° C.

Since the oxidation preventing film 28 is formed before the annealing, the third conductive plug 27 can be prevented from being oxidized during the annealing, so that the contact failure can be suppressed.

After this annealing is completed, the oxidation preventing film 28 is etched-back and removed.

Next, as shown in FIG. 3O, a multi-layered metal film 29 is formed by the sputtering method on inner surfaces of the second holes 26b and on an upper surface of the first insulating film 26. The multilayered metal film 29 is constructed from a titanium film 29x of about 60 nm thickness, a titanium nitride film (not shown) of about 30 nm thickness, a copper-containing aluminum film 29y of about 400 nm thickness, and a reflection preventing metal film 29z made of a titanium nitride film of about 70 nm thickness.

Next, as shown in FIG. 3P, first-level metal wirings 29a are formed by patterning the multi-layered metal film 29 through a photolithography. Out of the first-level metal wirings 29a, those formed above the capacitors Q are electrically connected to the upper electrodes 23a through the second holes 26b. On the other hand, the first-level metal wirings 29a formed above the second source/drain region 8b is electrically connected to the third conductive plug 27.

Moreover, as shown in FIG. 3Q, an alumina film is formed to a thickness of about 50 nm on the first insulating film 26 and on the first-level metal wirings 29a by the MOCVD method as a second hydrogen diffusion preventing insulating film 31. This second hydrogen diffusion preventing insulating film 31 is not limited to the alumina film. The second hydrogen diffusion preventing insulating film 31 may be formed of any one of an alumina film, an aluminum nitride film, a tantalum oxide film, a tantalum nitride film, a titanium oxide film, and a zirconium oxide film.

The second hydrogen diffusion preventing insulating film 31 plays a role of blocking reductant such as hydrogen, which may intrude into the capacitors Q from above, and thereby preventing deterioration of the capacitor dielectric film 22a due to the reductant.

Additionally, similar to the first hydrogen diffusion preventing insulating film 25, the second hydrogen diffusion preventing insulating film 31 is formed by the MOCVD method which can form a film with good coverage properties. Therefore, the second hydrogen diffusion preventing insulating film 31 can be formed with sufficient thickness on the side surfaces of the adjacent first-level metal wirings 29a of narrow space.

Next, as shown in FIG. 3R, a silicon oxide film is formed to a thickness of about 50 nm on the second hydrogen diffusion preventing insulating film 31 as a wiring protection insulating film 32 in the HDPCVD chamber 100 described in FIG. 2.

Similar to the capacitor protecting insulating film 24, when the wiring protection insulating film 32 is deposited, an atmosphere in the HDPCVD chamber 100 is made into plasma by turning-on only the first high-frequency power supply 106 (see FIG. 2), while the second high-frequency power supply 107 for supplying a high-frequency bias electric power is kept turned off.

According to this, ions and oxygen radicals in the film deposition atmosphere cannot be drawn toward the semiconductor substrate 1, and it is made possible to prevent sputter-etching by collision of ions and the like from reaching the second hydrogen diffusion preventing insulating film 31. As a result, it becomes possible to maintain a film thickness of the second hydrogen diffusion preventing insulating film 31 at a level necessary for blocking reductant such as hydrogen.

Furthermore, as to a film deposition condition of this wiring protection insulating film 32, a condition for reducing moisture content in the film, that is, for example, the same deposition condition for the capacitor protecting insulating film 24 (described later), is employed.

Next, as shown in FIG. 3S, in order to reduce moisture content of the wiring protection insulating film 32, the wiring protection insulating film 32 is dehydrated by an $N_2O$ plasma treatment. A condition for this $N_2O$ plasma treatment is, for example, a substrate temperature of about 200° C. to 450° C., and a process time of about 4 minutes.

Note that this dehydration process is optional, and if moisture content of the wiring protection insulating film 32 is sufficiently low, there is no need to carry out this process.

Next, as shown in FIG. 3T, a silicon oxide film is formed on the wiring protection insulating film 32 as a second insulating film 33 in the HDPCVD chamber 100 described in FIG. 2. A thickness of this second insulating film 33 is enough to fill spaces between the adjacent first-level metal wirings 29a, which is, for example, about 700 nm on the first insulating film 26 where the first-level metal wirings 29a are not formed.

Here, the second high-frequency power supply 107 (see FIG. 2) is turned off at the time of forming the wiring protection insulating film 32. On the contrary, not only the first high-frequency power supply 106 for generating a plasma, but also the second high-frequency power supply 107 are turned on at the time of forming this second insulating film 33, whereby a bias electric power is applied to a film deposition atmosphere.

As a result, when forming the second insulating film 33, ions and oxygen radicals are drawn toward the semiconductor substrate 1 due to the high-frequency bias electric power. Therefore, while generation of voids in the spaces between the adjacent first-level metal wirings 29a is suppressed by sputter-etching with these ions and the like, these spaces are preferably filled with the second insulating film 33.

Furthermore, because the wiring protection insulating film 32 is formed in advance under the second insulating film 33, it becomes possible to prevent the second hydrogen preventing insulating film 31 from being etched due to the sputter-etching in an initial phase of a deposition process of the second insulating film 33. Thereby, a hydrogen blocking effect of the second hydrogen preventing insulating film 31 can be well maintained.

Although a deposition condition for the second insulating film 33 is not particularly limited, a gas mixture of $SiH_4$ gas, $O_2$ and argon is used as a film deposition gas in the present embodiment. Additionally, flow rates of $SiH_4$ gas, $O_2$ and argon are set to 70 sccm, 525 accm and 420 sccm, respectively. Moreover, a power of the first high-frequency power supply 106 for plasma generation is set to 2400 W, and a power of the second high-frequency power supply 107 for bias application is set to 3500 W. Furthermore, a pressure of a film deposition atmosphere in the chamber is set to about 15 mTorr, and a substrate temperature is set between 175 and 400° C.

Additionally, in the case where the $N_2O$ plasma treatment described in FIG. 3S is omitted, the wiring protection insulating film 32 and the second insulating film 33 are continuously deposited in the chamber 100 shown in FIG. 2, whereby manufacturing process can be shorten as compared to the case where these films are deposited one by one in different chambers.

Next, as shown in FIG. 3U, the second insulating film 33 is dehydrated by applying the $N_2O$ plasma treatment to the second insulating film 33. A condition for this $N_2O$ plasma treatment is, for example, a substrate temperature of about 200° C. to 450° C., and a process time of about 4 minutes.

Note that, if moisture content of the second insulating film 32 is sufficiently low, this dehydration process may be omitted.

Next, processes until a cross-sectional structure shown in FIG. 3V is obtained will be described.

First, an alumina film is formed to a thickness of about 50 nm by an MOCVD method on the second insulating film 33, and this alumina film is used as a third hydrogen diffusion preventing insulating film 34.

Then, by placing the silicon substrate 1 in the chamber 100 shown in FIG. 2 again, growth of the second insulating film 33 is restarted from an upper surface of the third hydrogen diffusion preventing insulating film 34. Similar to the second insulating film 33 under the third hydrogen diffusion preventing insulating film 34, this second insulating film 33 is formed by turning-on both the first and second power supplies 106 and 107.

In this manner, the film deposition of the second insulating film 33 is once suspended and, after the third hydrogen diffusion preventing insulating film 34 is formed, the film deposition of the second insulating film 33 is restarted in the present embodiment. Therefore, it becomes possible for the third hydrogen diffusion preventing insulating film 34 to inhibit a film deposition atmosphere for the second insulating film 33, to which the bias electricity is applied, from deteriorating the capacitor dielectric film 22a.

Next, as shown in FIG. 3W, for the purpose of removing unevenness that is formed in an upper surface of the second insulating film 33 in a manner reflecting a shape of the first-level metal wirings 29a, the upper surface of the second insulating film 33 is polished and planarized by a CMP method.

Next, as shown in FIG. 3X, the second insulating film 33 is dehydrated by applying an $N_2O$ plasma treatment to an upper surface of the second insulating film 33 under a condition of, for example, a substrate temperature of about 200° C. to 450° C., and a process time of 4 minutes.

Note that this $N_2O$ plasma treatment is optional, and may be omitted when moisture content of the second insulating film 33 is sufficiently low.

Next, as shown in FIG. 3Y, after a resist pattern (not shown) is formed on the second insulating film 33, films from the top of the second insulating film 33 to the second hydrogen diffusion preventing insulating film 31 is patterned while using the resist pattern as a mask, thereby forming third hole 37 in these insulating films on the first-level metal wiring 29a. This etching is performed, for example, by using a parallel plate type plasma etching apparatus and employing a gas mixture of $C_4F_4$ gas, Ar, $O_2$ and CO as an etching gas. After this etching is completed, the resist pattern used as a mask is removed.

Next, processes until a cross-sectional structure shown in FIG. 3Z is obtained will be described.

First, a titanium nitride film is formed by sputtering to a thickness of about 100 nm as a glue film 38a on an upper surface of the second insulating film 33 and on an inner surface of the third hole 37. Then, a tungsten film 38b is formed on the glue film 38a by the CVD method using tungsten hexafluoride gas, and the third hole 37 is completely filled with this tungsten film 38b. Thereafter, excess glue film 38a and tungsten film 38b on the second insulating film 35 is polished and removed by a CMP method, and these films are left only in the third hole 37 as a fourth conductive plug 38.

Next, as shown in FIG. 4, a metal laminated film is formed on each of the upper surfaces of the fourth conductive plug 38 and the second insulating film 33 by a sputtering method, and this metal laminated film is patterned and left on the fourth conductive plug 38 as a second-level metal wiring 39.

By the above described processes, a basic structure of the semiconductor device according to the present embodiment is completed.

According to the present embodiment, as shown in FIG. 3J, the capacitor protecting insulating film 24 covering the capacitors Q is formed and, thereafter, the first insulating film 26 is formed.

As mentioned in the above, in order to bury the spaces between the adjacent capacitors Q, the first insulating film 26 is formed by applying the high-frequency bias power electricity to the film deposition atmosphere. At the time of forming the first insulating film 26, film deposition and sputter-etching progress simultaneously due to the high-frequency bias power electricity. However, the capacitor protecting insulating film 24 can prevent the sputter-etching from affecting to the first hydrogen diffusing preventing insulating film 25. As such, it is made possible to prevent the thickness of the first hydrogen diffusing preventing insulating film 25 from reducing.

Accordingly, in the present embodiment, it is possible to favorably fill spaces between the adjacent capacitors Q with the first insulating film 26, while maintaining the thickness of the first hydrogen diffusing preventing insulating film 25 at a level necessary for blocking reductants such as hydrogen and the like.

Here, the second high-frequency power supply 107 for bias application is switched off when the abovementioned capacitor protecting insulating film 24 is formed. Advantages brought by the film formed without applying a bias electric power in this manner will be described hereinafter with reference to FIG. 5.

Figure 5:
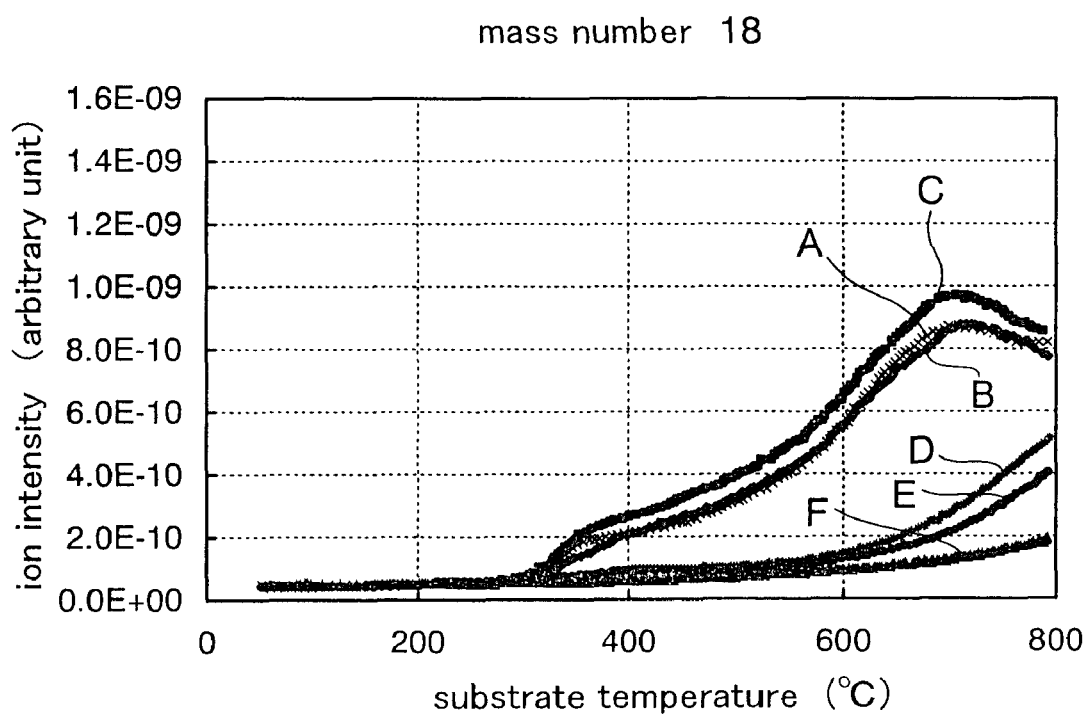
FIG. 5 is a graph obtained by examining in a TDS method, moisture content in a silicon oxide film formed by applying a bias electric power, and moisture content in a silicon oxide film formed without applying a bias electric power.

FIG. 5 is a graph obtained by examining moisture contents in silicon oxide films (with bias) each formed with applying a bias electric power from the second high-frequency power supply 107, and in silicon oxide films (without bias) formed without applying a bias electric power. Moisture contents are measured by a TDS (Thermal Desorption Spectrometry) method. Note that each of these silicon oxide films was formed directly on a silicon substrate.

In FIG. 5, the horizontal axis represents substrate temperatures during measurement by the TDS method, and the vertical axis represents ion intensity (with an arbitrary unit) of ions that leaves the silicon oxide films and have a mass number of 18 (water).

Additionally, in this measurement, a plurality of samples were prepared by varying flow rates of $SiH_4$ gas, $O_2$ and argon in a film deposition gas, and graphs were obtained for these samples.

As shown in FIG. 5, in each of the silicon oxide films (with bias) each formed with applying a bias electric power from the second high-frequency power supply 107, a larger amount of moisture were left from the films as the substrate temperature increases.

On the contrary, it can be found that, in each of the silicon oxide films (without bias) each formed without applying a bias electric power from the second high-frequency power supply 107, an amount of moisture left from the films was extremely smaller than in the case where the bias electric power was applied.

In this manner, in a silicon oxide film formed in HDPCVD chamber 101 without applying a bias electric power, moisture content is much smaller than that formed with applying a bias electric power. Accordingly, moisture content in the capacitor protecting insulating film 24 formed without applying a bias electric power becomes much smaller than that in the first insulating film 26 formed with applying a bias electric power. Likewise, moisture content in the wiring protection insulating film 32 becomes much smaller than that in the second insulating film 33.

In another examination conducted by the inventors of the present invention, the following was also found out. That is, if a silicon oxide film having moisture content larger than that of the present embodiment is formed as the capacitor protecting insulating film 24, and the first insulating film 26 is formed on the capacitor protecting insulating film 24 with applying a bias electric power, ferroelectric characteristics of the capacitor dielectric film 22a, such as a residual polarization charge, are considerably reduced.

On the contrary, in the present embodiment, the capacitor protecting insulating film 24 is formed without applying a bias electric power as mentioned above. Therefore, it become possible to extremely reduce moisture content in the capacitor protecting insulating film 24, and hence it becomes possible to prevent deterioration of the capacitor dielectric film 22a due to the moisture content.

In the followings, a condition realizing a further reduction of the moisture content in the film will be considered as a film deposition condition for the capacitor protecting insulating film 24.

(a) First deposition condition

In this film deposition condition, as compared to a film deposition gas (hereinafter, referred to as the first deposition gas) for forming the first insulating film 26 (see FIG. 3J), an oxygen flow rate ratio in a film deposition gas (hereinafter, referred to as the second film deposition gas) for forming the capacitor protecting insulating film 24 is made larger. It should be noted that the oxygen flow rate ratio is defined as a ratio of the oxygen flow rate to the flow rate of the entire film deposition gas.

By increasing an oxygen flow rate ratio in the second film deposition gas for the capacitor protecting insulating film 24, hydrogen in a film deposition atmosphere easily reacts with oxygen, so that moisture is allowed to be easily exhausted to the outside of the chamber 100 (refer to FIG. 2) before the moisture reaches the semiconductor substrate 1. As a result, it becomes difficult for moisture to be captured into the capacitor protecting insulating film 24, whereby it becomes possible to make the moisture content of the capacitor protecting insulating film 24 lower than that of the first insulating film 26.

(b) A second film deposition condition

In this film deposition condition, a pressure of a film deposition atmosphere for the capacitor protecting insulating film 24 is made higher than a pressure of a film deposition atmosphere for the first insulating film 26.

According to this, the moisture content in the film deposition atmosphere of the capacitor protecting insulating film 24 is allowed to be easily exhausted to the outside of the chamber 100 before reaching the semiconductor substrate 1. Therefore, it becomes possible to make the moisture content of the capacitor protecting insulating film 24 lower than that of the first insulating film 26.

In order to make moisture content of the capacitor protecting insulating film 24 sufficiently lower than that of the first insulating film 26, it is necessary to employ a condition satisfying at least any one of the abovementioned first and second film deposition conditions.

Here, one example of a condition satisfying both of the first and second film deposition conditions is as follows:

a flow rate of $SiH_4$ gas □c 70 sccm
a flow rate of $O_2$ □c 525 sccm
a flow rate of argon □c 420 sccm
a pressure of the film deposition atmosphere □c 1 Torr
a substrate temperature □c 400° C.
a power of the first high-frequency power supply 106 □c 2400 W (c) A third deposition condition:

In both of the abovementioned first and second film deposition conditions, a gas mixture of $SiH_4$ gas, $O_2$ and argon is used as the second film deposition gas for the capacitor protecting insulating film 24.

On the other hand, in this third deposition condition, a gas mixture of TEOS gas and $O_2$ is supplied to the chamber 100 (see FIG. 2) as the second deposition gas for the capacitor protecting insulating film 24. It was found that moisture content in the capacitor protecting insulating film 24 becomes lower with a plasma CVD method using TEOS gas as compared to a case with a plasma CVD method using $SiH_4$ gas.

One example of the third deposition condition is as follows:

a flow rate of TEOS gas □c 760 mg/minute
a flow rate of $O_2$ □c 2980 sccm
a pressure of the film deposition atmosphere □c 9 Torr
a substrate temperature □c 390° C.
a power of a high-frequency power supply to be applied to the film deposition atmosphere □c 700 W Note that helium (He) is used as a carrier gas for TEOS, and that a flow rate of helium is set to 720 sccm.

Moreover, the second high-frequency power supply 107 (see FIG. 2) for applying a high-frequency bias electricity is switched off in this condition. Additionally, instead of the HDPCVD chamber 100 described in reference to FIG. 2, the capacitor protecting insulating film 24 may be formed by using another chamber that can apply only a high-frequency plasma-generating electric power to the film deposition atmosphere.

Moisture content of the capacitor protecting insulating film 24 deposited under the foregoing condition was approximately $5 \times 10^{-3}$ g/cm$^{-3}$.

In the present embodiment, by adopting any one of the abovementioned first to third deposition conditions, moisture content of the capacitor protecting insulating film 24 is reduced. Then, on the capacitor protecting insulating film 24 thus having low moisture content, the first insulating film 26 is formed under the condition where the high-frequency bias electricity is applied to the film deposition atmosphere from the second high-frequency power supply 107.

According to an examination conducted by the inventors of the present invention, it became clear that, when a film having high moisture content is formed as the capacitor protecting insulating film 24, the ferroelectric characteristics of the capacitor dielectric film 22a are considerably deteriorated by formation of the first insulating film 26.

On the other hand, in the present embodiment, because moisture content in the capacitor protecting insulating film 24 is reduced in the manner described above, deterioration of the capacitor dielectric film 22a can be prevented even if the first insulating film 26 is formed on the capacitor protecting insulating film 24. Furthermore, because a high-frequency bias electric power is applied to a film deposition atmosphere of the first insulating film 26, it becomes possible to favorably bury the spaces between the adjacent capacitors Q with the first insulating film 26, whereby it is possible to meet the miniaturization of semiconductor devices that is expected to progress in the future.

Note that a substrate temperature in forming the capacitor protecting insulating film 24 is not limited to those in the abovementioned first to third film deposition conditions. However, because it was found that if the substrate temperature is too high, the capacitor dielectric film 22a is deteriorated, it is preferable that the substrate temperature be as low as possible.

Additionally, although a description has been made for reducing moisture content in the capacitor protecting insulating film 24 than that in the first insulating film 26 in the above, the same is also applicable to the case of the wiring protection insulating film 32 and the second insulating film 33 (see FIG. 3T). That is, by employing any one of the abovementioned first to third film deposition conditions as the condition for the wiring protection insulating film 32, it becomes possible to reduce moisture content in the wiring protection insulating film 32 lower than that in the second insulating film 33. Thereby, deterioration of the capacitor dielectric film 22a in forming the second insulating film 33 can be prevented.

Furthermore, the wiring protection insulating film 32 functions to protect the first-level metal wirings 29a against sputter-etching which progresses simultaneously with the deposition of the second insulating film 33. Thereby, it becomes possible to prevent the first-level metal wirings 29a from being etched when the second insulating film 33 is deposited.

In the following, a description will be given of an examination conducted by the inventors of the present invention for examining in what deposition condition an influence of the abovementioned sputter-etching becomes stronger with respect to a silicon oxide formed by applying a high-frequency bias electric power to a film deposition atmosphere.

Figure 6A:
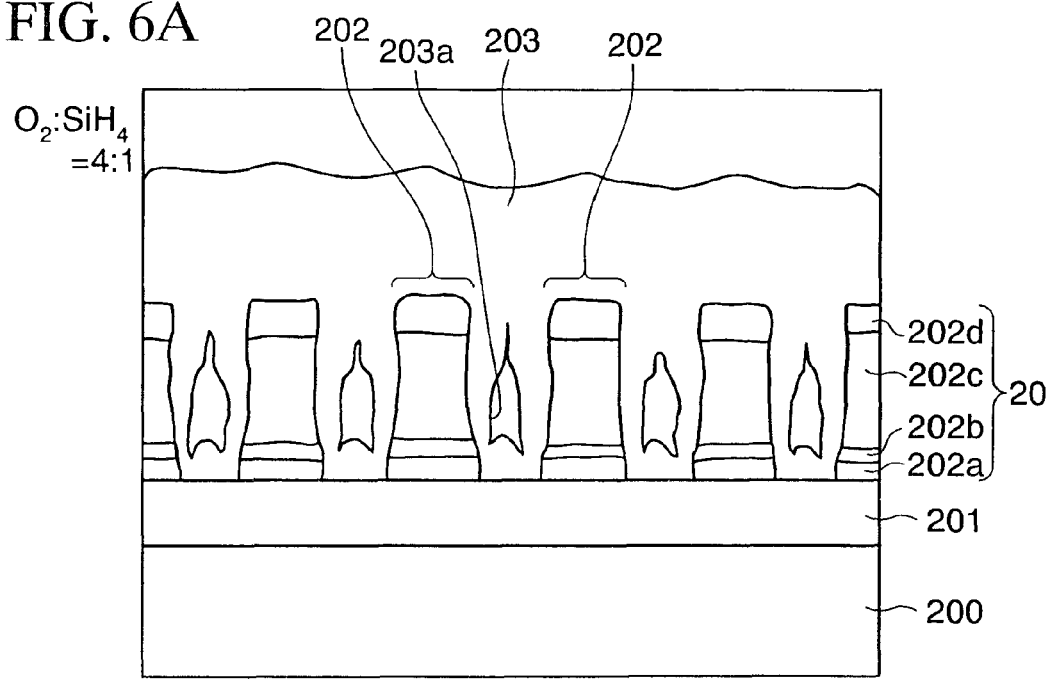
FIGS. 6A and 6B are illustrations drawn based on cross-sectional SEM images of a silicon oxide film formed by changing $O_2$ flow rates in reactant gas.
Figure 6B:
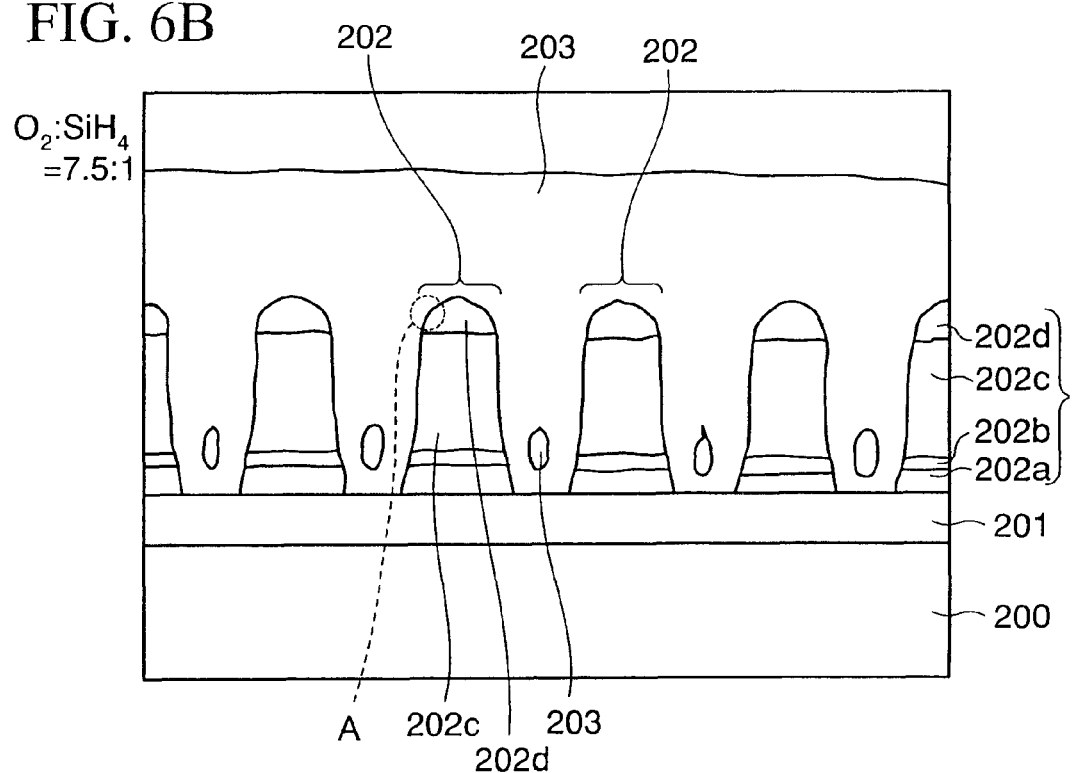

FIGS. 6A and 6B are views drawn based on cross-sectional SEM (Scanning Electron Microscope) images of silicon oxide films 203 formed by changing $O_2$ flow rate ratios in a reaction gas.

Note that, in these examples, gas mixture of $SiH_4$ (silane), $O_2$ (oxygen) and Ar (argon) was used as a reaction gas for the silicon oxide films 203. Furthermore, high-frequency bias electric powers from the second high-frequency power supply 107 (see FIG. 2) were applied to film deposition atmospheres of the respective silicon oxide films 203.

Additionally, each of samples used in this examination was obtained by forming a base silicon oxide film 201, metal wirings 202, and the silicon oxide film 203 in this order on a silicon substrate 200. Note that the metal wirings 202 were constructed from a titanium film 202a, a titanium nitride film 202b, a copper-containing aluminum film 202c, and a titanium nitride film 202d which functions as a reflection preventing metal film.

In FIG. 6A, a flow rate of $O_2$ was made 4 times as much as that of $SiH_4$. On the other hand, in FIG. 6B, a flow rate of $O_2$ was made 7.5 times as much as that of $SiH_4$.

As shown in FIG. 6A, when a flow rate ratio of $O_2$ and $SiH_4$ was 4:1, voids 203a ware largely formed, so that the space between the adjacent metal wirings 202 could not preferably be filled with the silicon oxide film 203.

On the contrary, in FIG. 6B where the flow rate ratio of $O_2$ and $SiH_4$ was increased to 7.5:1, voids 203 were reduced in size to a considerable degree, so that spaces between adjacent metal wirings 202 were preferably filled with the silicon oxide film 203.

However, as shown in FIG. 6B, it was found that the titanium nitride film 202d constituting the metal wiring 202 was scraped off by the sputter-etching in depositing the silicon oxide film 203, and that the thickness of the titanium nitride film 202d is reduced on the shoulder A of the metal wirings 202.

Thus, in the CVD method where the bias electric power is applied, gap-filling characteristics of the silicon oxide film are enhanced by increasing the flow rate ratio of oxygen in the reaction gas, whereas the sputter-etching action is enhanced and thus the base film is etched by increasing oxygen.

Figure 7:
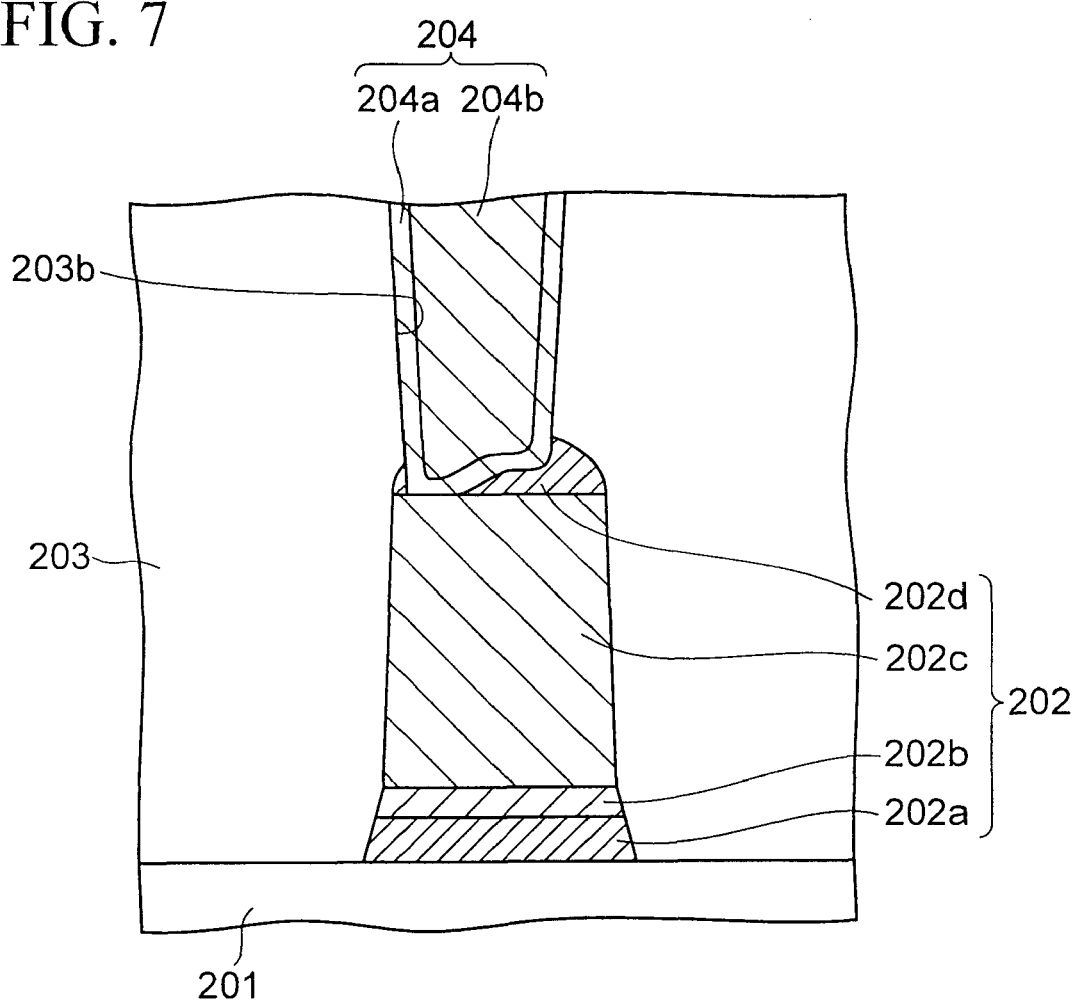
FIG. 7 is a cross-sectional view for explaining disadvantages caused by having a base film shaved off in a CVD method where a bias electric power is applied.

FIG. 7 is a cross-sectional view for explaining a disadvantage caused by the etching of the base film.

In an example in FIG. 7, a hole 203b was formed in the silicon oxide film 203 on the metal wiring 202, and then a conductive plug 204 electrically connected to the metal wiring 202 was formed in this hole 203b. This conductive plug 204 was constructed by forming a glue film 204a and a tungsten film 204b in this order, the glue film 204 being formed of a titanium nitride film.

As described in the above, since the titanium nitride film 202d was sputter-etched at the time of forming the silicon oxide film 203, the hole 203b went through the titanium nitride film 202d and reached the aluminum film 202c, so that the conductive plug 204 and the aluminum film 202c were direct contact with each other.

However, it was found that, if titanium nitride or tungsten constituting the conductive plug 204 makes contact with the aluminum film 202c, contact resistance between the conductive plug 204 and the metal wiring 202 increases.

On the contrary, in this embodiment, the wiring protection insulating film 33 is formed in advance under the second insulating film 33 as shown in FIG. 3Z. Accordingly, the reflection preventing metal film 29z on a shoulder of the first-level metal wiring 29a is not sputter-etched when the second insulating film 33 is formed. Therefore, it becomes possible to avoid direct contact of the fourth conductive plug 38 with the aluminum film 29y constituting the first-level metal wiring 29a. Thereby, a contact resistance between the first-level metal wiring 29a and the fourth conductive plug 38 cannot be increased, and hence it becomes possible to prevent a malfunction of a circuit.

Particularly, in the case where the abovementioned "(a) First film deposition condition" is employed, a flow rate ratio of the oxygen in the film deposition gas for forming the first insulating film 26 is made smaller than that in the film deposition gas for forming the capacitor protecting insulating film 24. Therefore, the influence of the sputter-etching due to oxygen is suppressed, and deterioration of the capacitors can be prevented.

(2) Second Embodiment

FIGS. 8A to 8E are cross-sectional views of a semiconductor device according to a second embodiment of the present invention, and each figure shows the semiconductor device in process of manufacture thereof.

In order to produce the semiconductor device according to the present embodiment, the processes described in FIGS. 3A to 3O in the first embodiment are first carried out.

Figure 8A:
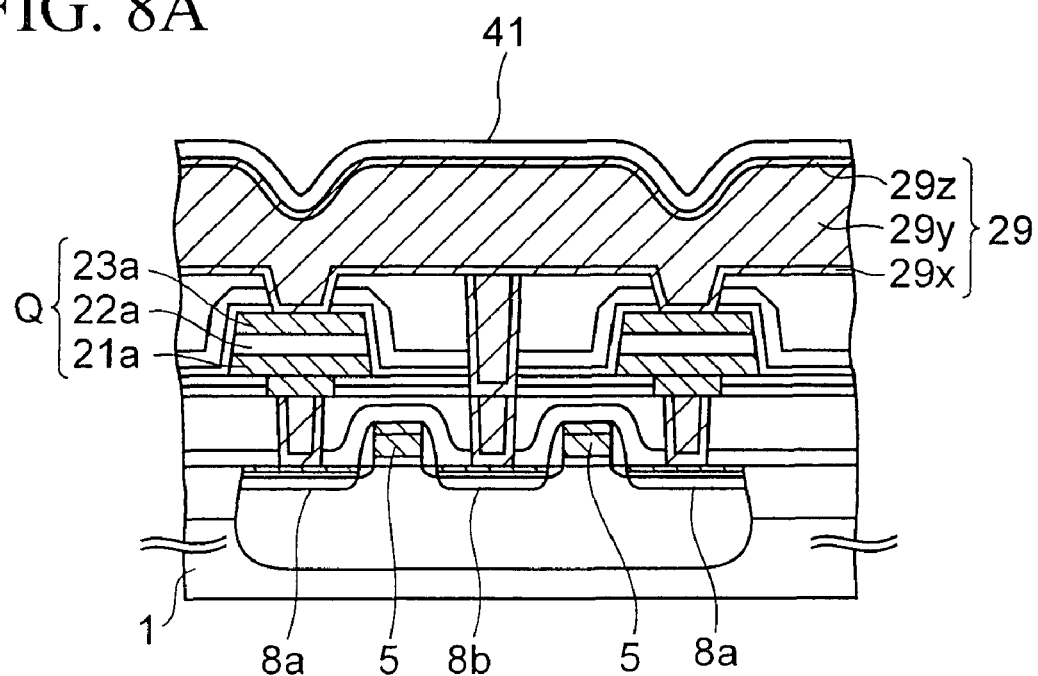
FIGS. 8A to 8E are cross-sectional views of a semiconductor device in progress of manufacturing processes during a second embodiment of the present invention.

Next, as shown in FIG. 8A, an alumina film is formed to a thickness of about 50 nm as a wiring cap insulating film 41 by a sputtering method on the multi-layered metal film 29.

Figure 8B:
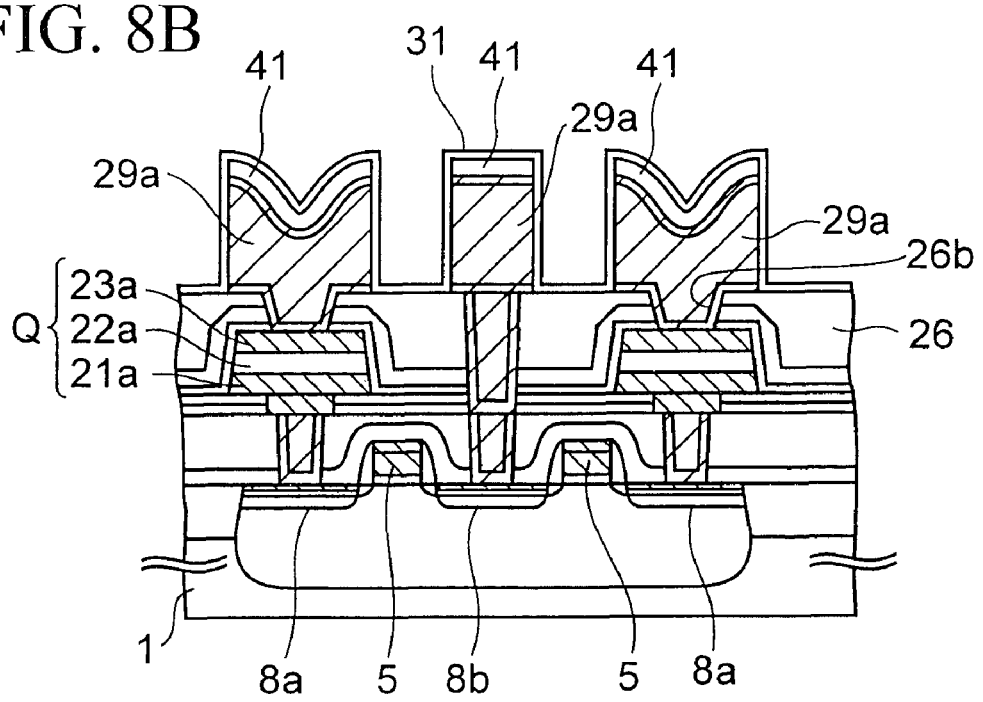

Then, by carrying out the processes described in FIGS. 3P and 3Q in the first embodiment, the second hydrogen diffusion preventing insulating film 31 formed of an alumina film of about 50 nm thickness is formed on an entire upper surface of the silicon substrate 1 as shown in FIG. 8B.

Figure 8C:
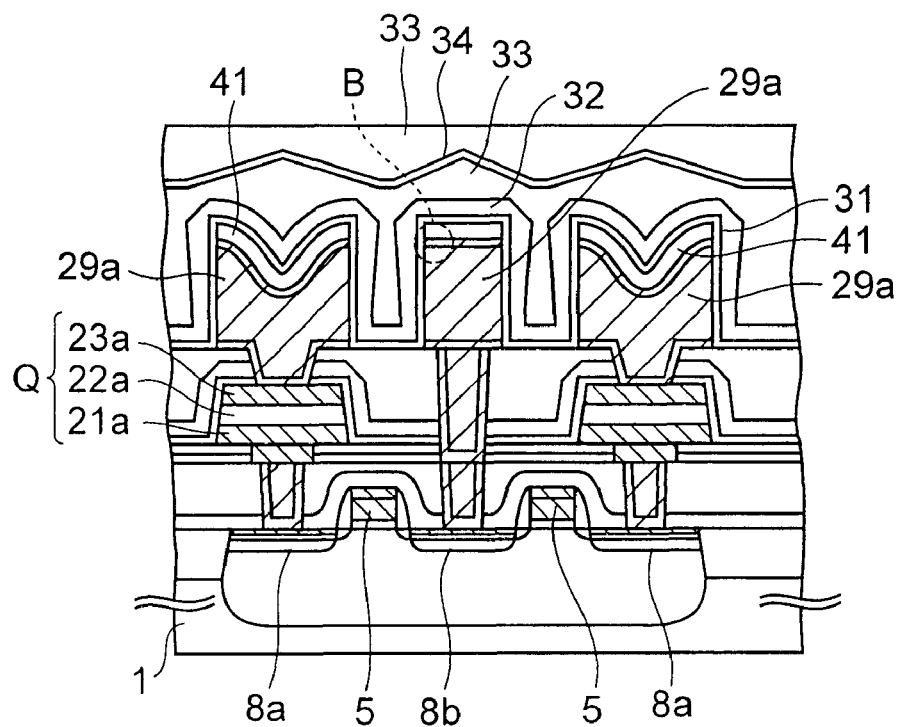

Furthermore, as shown in FIG. 8C, by carrying out the processes described in FIGS. 3R to 3X in the first embodiment, the wiring protection insulating film 32, a lower layer of the second insulating film 33, the third hydrogen diffusion preventing insulating film 34, and an upper layer of the second insulating film 33 are formed in this order on the second hydrogen diffusion preventing insulating film 31.

Figure 8D:
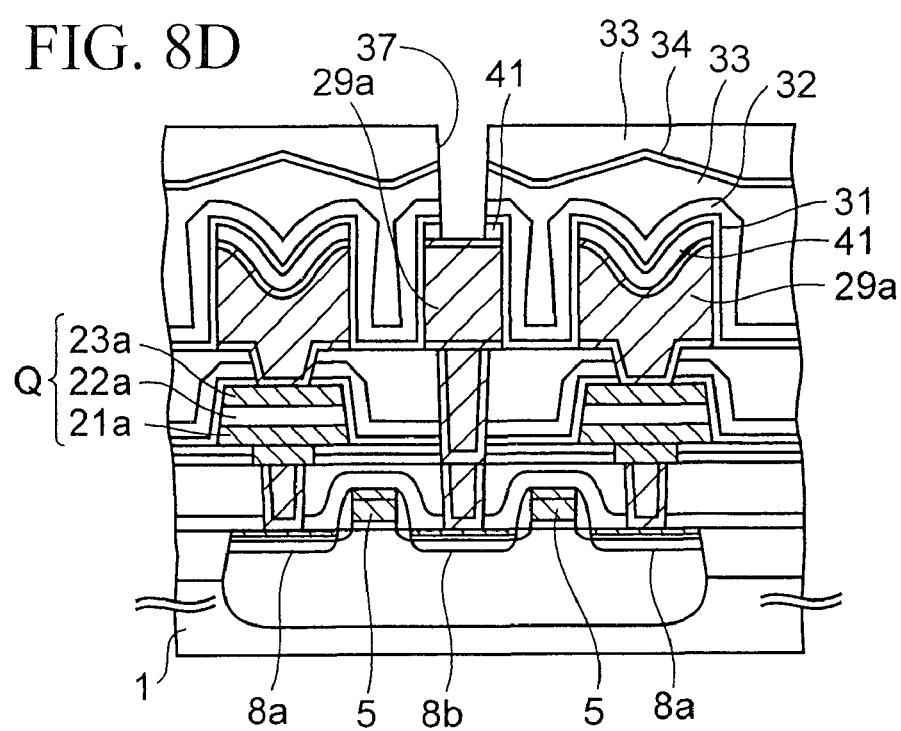

Next, as shown in FIG. 8D, by patterning the insulating films 31 to 34 and 41 through a photolithography, a third hole 37 is formed in these insulating films on the first-level metal wiring 29a, thereby exposing the first-level metal wiring 29a in the third hole 37.

Note that, this patterning is carried out by forming a resist pattern (not shown) on the second insulating film 33, and using the gas mixture of $C_4F_8$ gas, Ar, $O_2$ and CO as an etching gas in a parallel plate type plasma etching apparatus. After this etching is completed, the resist pattern used as a mask is removed.

Figure 8E:
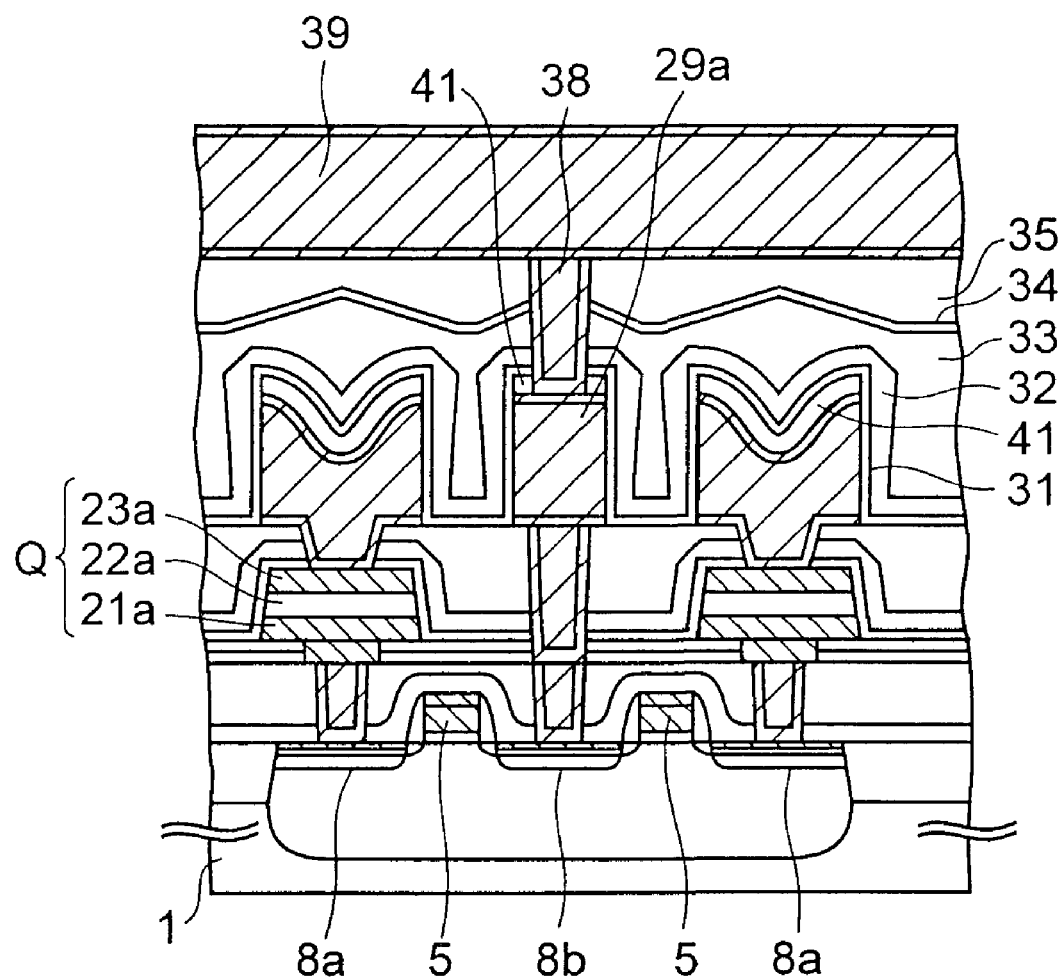

Thereafter, by carrying out the processes described in FIGS. 3Z and 4 of the first embodiment, as shown in FIG. 8E, a structure where a second-level metal wiring 39 is formed in an uppermost layer is obtained.

According to the present embodiment, as shown in FIG. 8C, the wiring cap insulating film 41 is formed on the first-level metal wirings 29a. Accordingly, if the wiring protection insulating film 32 is sputter-etched in the vicinity of a shoulder B of the first-level metal wiring 29a at the time of forming the second insulating film 33 by a plasma CVD method in which a bias electric power is applied to a deposition atmosphere, the sputter-etching does not reach the first-level metal wiring 29a because of the wiring cap insulating film 41.

Figure 9:
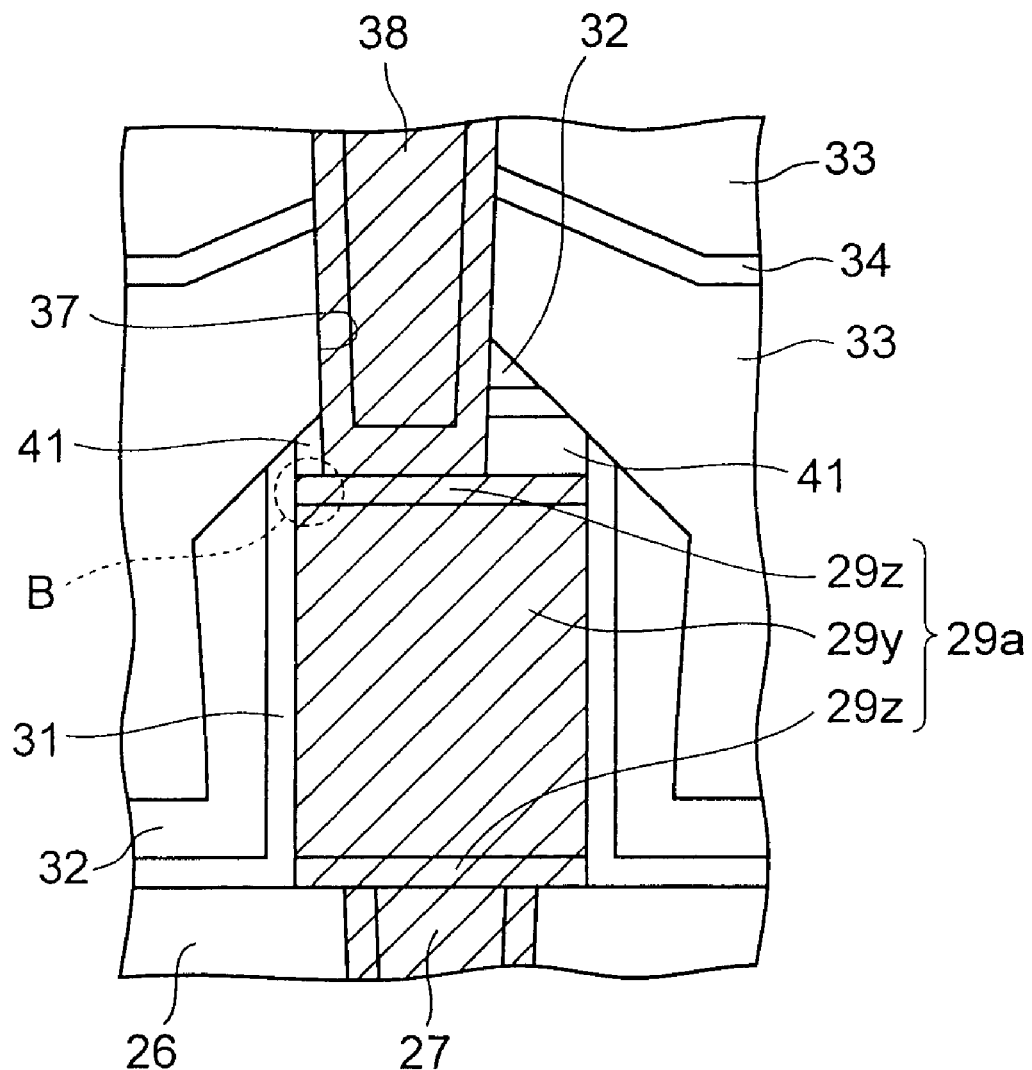
FIG. 9 is a cross-sectional view for explaining advantages obtained in the second embodiment of the present invention.

Therefore, as shown in FIG. 9, even if the third hole 37 is dislocated and formed near the shoulder B of the first-level metal wiring 29a, the wiring cap insulating film 41 is capable of preventing the first-level metal wiring 29a from being excessively etched when the third hole 37 is formed, and thereby, it becomes possible to prevent the reflection preventing metal film 29z constituting the first-level metal wiring 29a from being removed.

As a result, it becomes possible to prevent the fourth conductive plug 38 and the aluminum film 29y constituting the first-level metal wiring 29a from contacting with each other, so that increase in contact resistance between the metal wiring 29a and plug 38 can be suppressed.

(3) Third Embodiment

FIGS. 10A to 10I are cross-sectional views of a semiconductor device according to a third embodiment of the present invention, each showing the semiconductor device in process of manufacture thereof.

In order to produce the semiconductor device of the present embodiment, the processes described in FIGS. 3A to 3D in the first embodiment are first carried out.

Figure 10A:
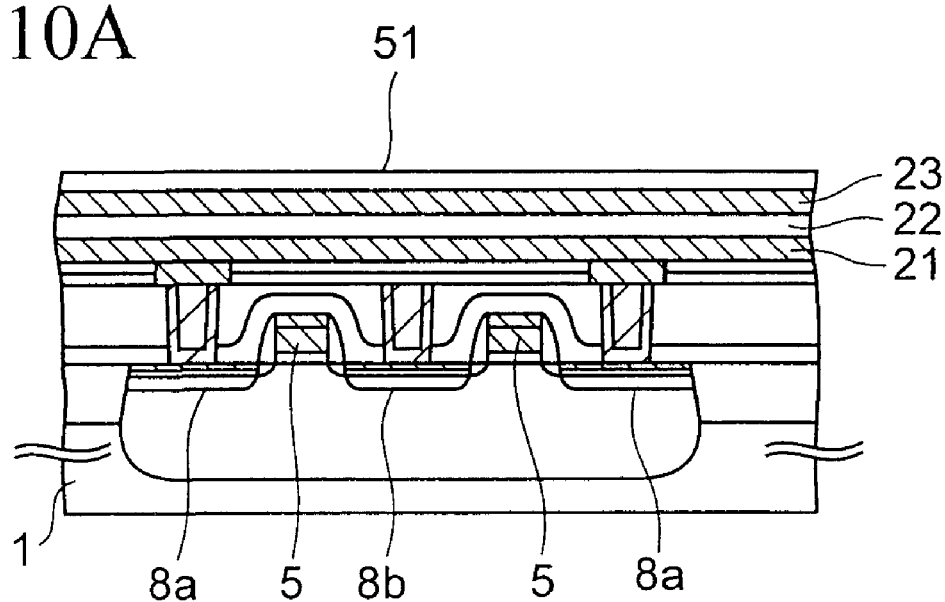
FIGS. 10A to 10I are cross-sectional views of the semiconductor device in progress of manufacturing processes during a third embodiment of the present invention.

Next, as shown in FIG. 10A, an alumina film is formed to a thickness of about 50 nm as a capacitor cap insulating film 51 by a sputtering method on the second conductive film 23.

Figure 10B:
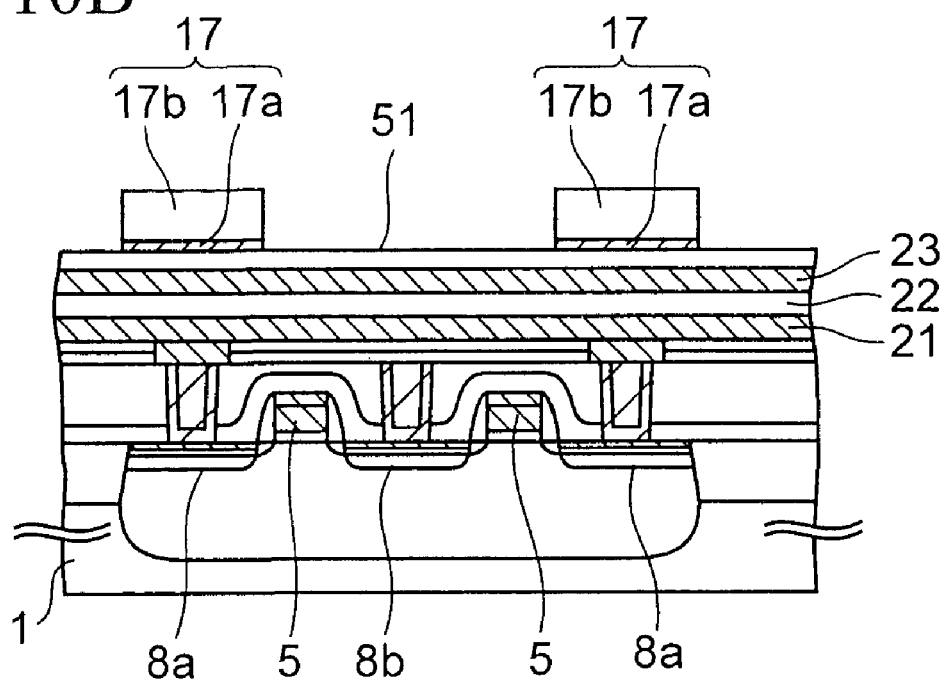

Next, as shown in FIG. 10B, the hard mask 17 described in FIG. 3E is formed on this capacitor cap insulating film 51.

Figure 10C:
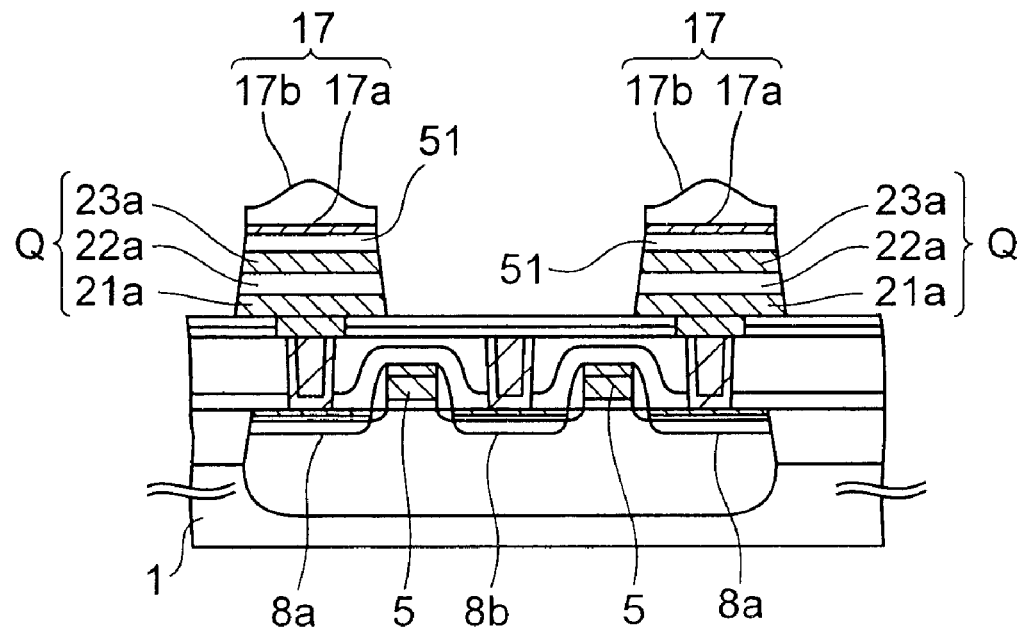

Subsequently, as shown in FIG. 10C, while using the hard mask 17 as an etching mask, the second conductive film 23, the ferroelectric film 22 and the first conductive film 21 are collectively plasma-etched through sputtering reactions in an atmosphere containing halogen elements.

According to this, the capacitors Q made by laminating the lower electrode 21a, the capacitor dielectric film 22a, and the upper electrode 23a in this order are formed, and the capacitor cap insulating film 51 are left on the upper electrodes 23a of the capacitors Q.

Thereafter, the hard mask 17 is removed.

Figure 10D:
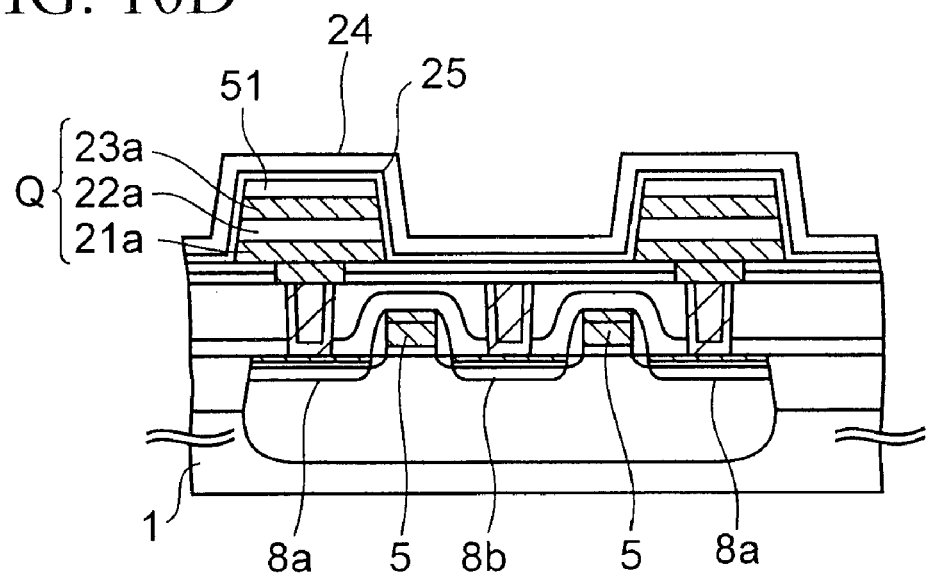

Then, as shown in FIG. 10D, by carrying out the processes described in FIGS. 3G and 3H in the first embodiment, the first hydrogen diffusion preventing insulating film 25 and the capacitor protecting insulating film 24 are formed in this order on upper surfaces of the capacitor cap insulating film 51 and side surfaces of the capacitors Q.

Figure 10E:
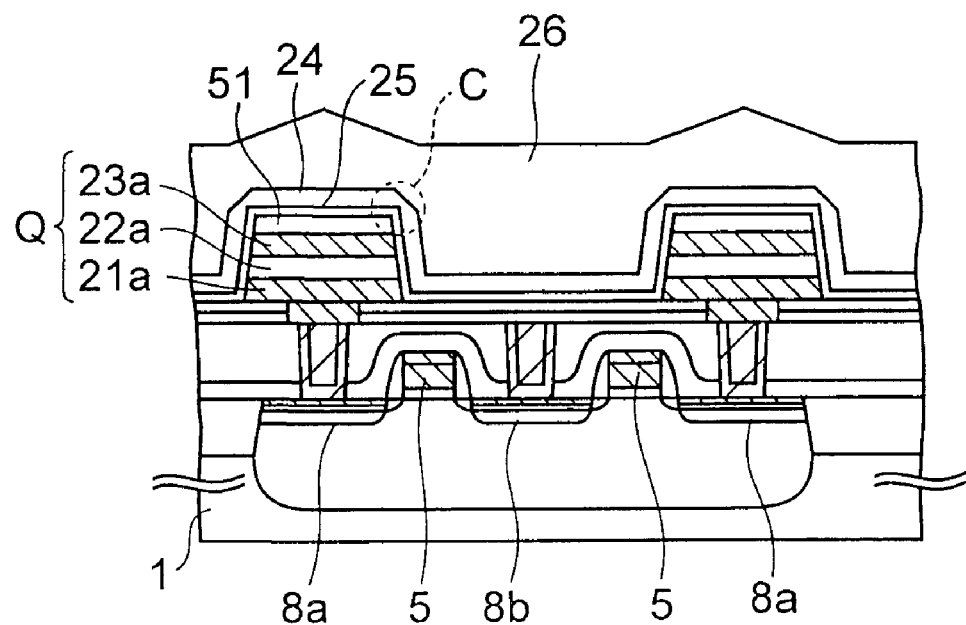

Next, as shown in FIG. 10E, while applying a high-frequency bias electric power to a film deposition atmosphere, and using the same deposition condition as the first embodiment, a silicon oxide film is formed on the capacitor protecting insulating film 24, and the silicon oxide film is used as a first insulating film 26.

Figure 10F:
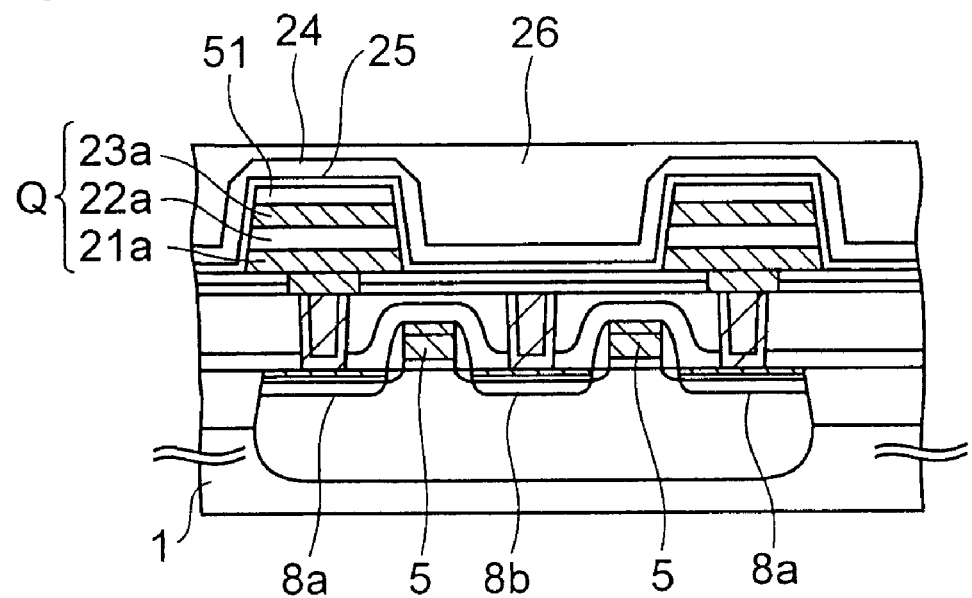

Thereafter, as shown in FIG. 10F, an upper surface of the first insulating film 26 is polished and planarized by a CMP method.

Figure 10G:
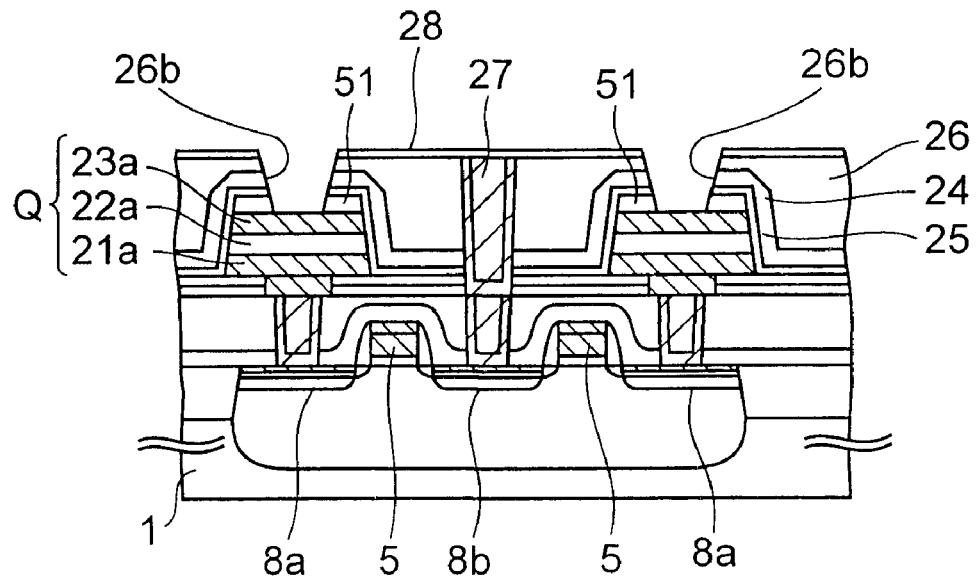

Next, as shown in FIG. 10G, by carrying out the processes described in FIG. 3N in the first embodiment, the second holes 26b are formed in the capacitor cap insulating film 51, the first hydrogen diffusion preventing insulating film 25, the capacitor protecting insulating film 24, the first insulating film 26 and the oxidation preventing film 28 on the upper electrodes 23a.

After that, the oxidation preventing film 28 is removed.

Figure 10H:
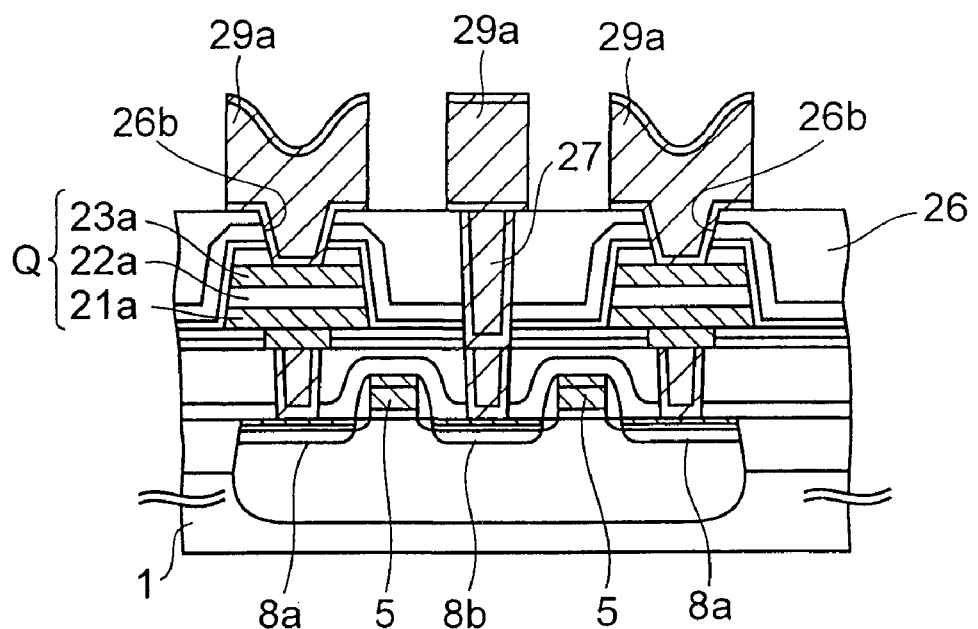

Then, as shown in FIG. 10H, the first-level metal wirings 29a, which are electrically connected to the upper electrodes 23a through the second holes 26b, are formed on the first insulating film 26. A method of forming these first-level metal wirings 29a is the same as the one described in the first embodiment, and a description thereof is omitted here.

Figure 10I:
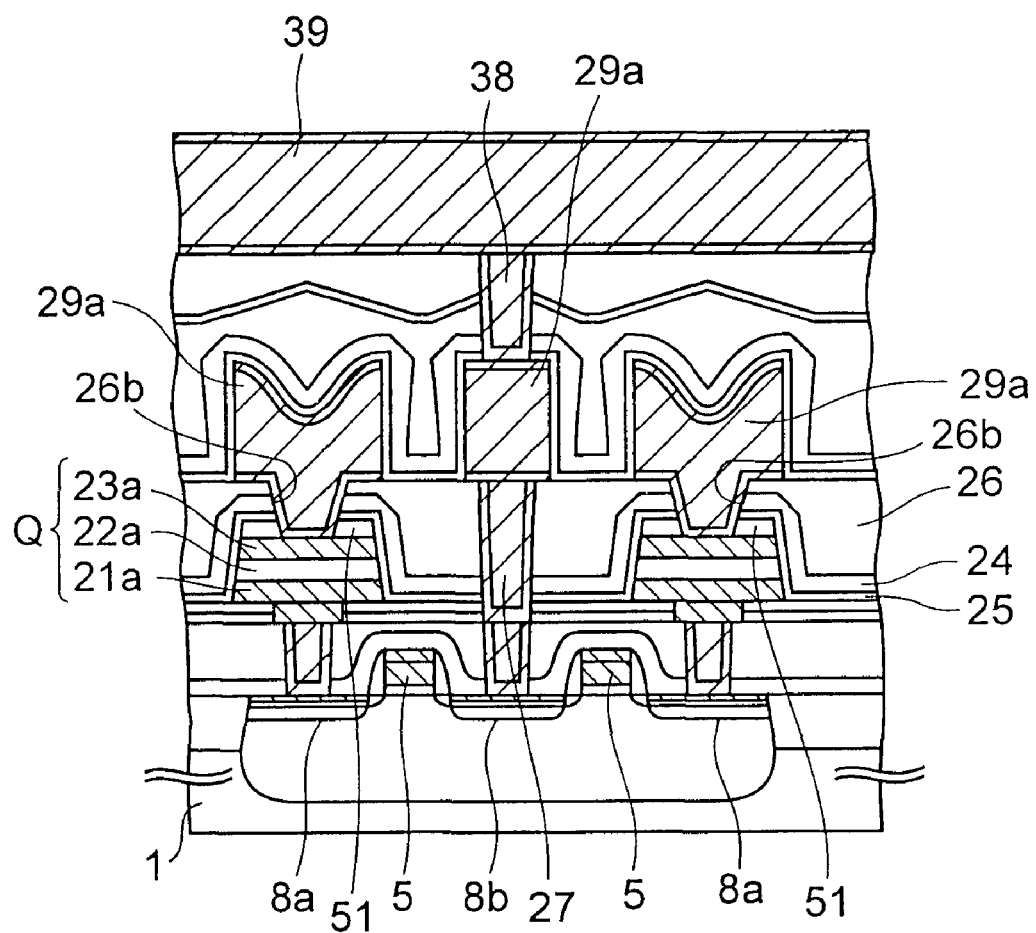

Thereafter, by carrying out the processes described in FIGS. 3Q to 3Z and 4, a structure shown in FIG. 10I is obtained.

According to the present embodiment, as shown in FIG. 10E, the first insulating film 26 is formed above the capacitors Q in a state where the capacitor cap insulating film 51 has been formed on the upper electrodes 23a.

As already described, when the first insulating film 26 is deposited, sputter-etching progresses simultaneously with the film deposition. Therefore, in some cases, the first hydrogen diffusion preventing insulating film 25, which serves to protect the capacitors Q against reductant such as hydrogen, is etched in the vicinities of shoulders C of the capacitors Q.

Even if the first hydrogen diffusion preventing insulating film 25 is thus etched, the etching is stopped by the capacitor cap insulating film 51 under the first hydrogen diffusion preventing insulating film 25. Therefore, the capacitor cap insulating film 51 remains on the upper electrodes 23a even after the deposition of the first insulating film 26 is completed, so that intrusion of hydrogen and the like into the capacitor dielectric film 22a from upsides thereof is blocked by the capacitor cap insulating film 51. Thereby, it becomes possible to prevent the capacitor dielectric film 22a from being reduced by hydrogen or the like, and from being deteriorated by reduction. As a result, quality of the capacitors Q can be well maintained over a long period of time.

As has been described in the above, according to the present invention, moisture content in the capacitor protecting insulating film is made lower than that in the first insulating film. Therefore, it becomes possible to prevent the capacitor dielectric film from being deteriorated by the deposition atmosphere of the first insulating film, and concurrently the capacitor protecting insulating film makes it possible to prevent the first hydrogen diffusion preventing insulating film from being etched.

Additionally, moisture content in the wiring protection insulating film is made lower than that in the second insulating film, whereby it becomes possible to prevent the capacitor dielectric film from being deteriorated at the time of forming the second insulating film. Moreover, the wiring protection insulating film makes it possible to prevent the metal wiring from being sputter-etched, whereby it becomes possible to suppress increase in contact resistance between the metal wiring and the conductive plug.

What is claimed is:

1. A method of manufacturing a semiconductor device, comprising the steps of:
   forming a base insulating film on a semiconductor substrate;
   forming a capacitor on the base insulating film, the capacitor being constructed by laminating a lower electrode, a capacitor dielectric film formed of a ferroelectric material, and an upper electrode;
   forming a hydrogen diffusion preventing insulating film covering the capacitor;
   forming a capacitor protecting insulating film on the hydrogen diffusion preventing insulating film; and
   forming a first insulating film on the capacitor protecting insulating film by a plasma CVD method where, while a high-frequency bias electric power is applied toward the semiconductor substrate, a plasma-generating high frequency electric power is applied to first deposition gas containing oxygen and silicon compound gas,
   wherein a condition by which moisture content in the capacitor protecting insulating film becomes less than that in the first insulating film is employed as a deposition condition for the capacitor protecting insulating film.

2. The method of manufacturing a semiconductor device according to claim 1, wherein the step of forming the capacitor protecting insulating film is carried out by using any one of:
- a plasma CVD method where, by using second deposition gas which contains oxygen and silicon compound gas and has a higher oxygen flow rate ratio than in the first deposition gas, and without applying a high-frequency bias electric power toward the semiconductor substrate, only a plasma-generating high-frequency electric power is applied to the second deposition gas;
- a plasma CVD method where, by using the second deposition gas and by setting a pressure of a deposition atmosphere higher than that in the step of forming the first insulating film, and without applying a high-frequency bias electric power toward the semiconductor substrate, only a plasma-generating high-frequency electric power is applied to the second deposition gas; and
- a plasma CVD method where, by using a third deposition gas containing TEOS gas and oxidizing gas, and without applying a high-frequency bias electric power toward the semiconductor substrate, only a plasma-generating high-frequency electric power is applied to the third deposition gas.

3. The method of manufacturing a semiconductor device according to claim 1, wherein any one of an alumina film, an aluminum nitride film, a tantalum oxide film, a tantalum nitride film, a titanium oxide film, and a zirconium oxide film is formed as the first hydrogen diffusion preventing insulating film.

4. The method of manufacturing a semiconductor device according to claim 1, wherein the step of forming the capacitor comprises the steps of:
- forming a first conductive film on the base insulating film;
- forming a ferroelectric film on the first conductive film;
- forming a second conductive film on the ferroelectric film;
- forming a capacitor cap insulating film on the second conductive film; and
- patterning the capacitor cap insulating film, the second conductive film, the ferroelectric film and the first conductive film into the capacitors.

5. The method of manufacturing a semiconductor device according to claim 4, wherein an alumina film is formed as the capacitor cap insulating film.

6. The method of manufacturing a semiconductor device according to claim 1, further comprising any one of the step of dehydrating the capacitor protecting insulating film by applying a nitrogen-containing plasma treatment to the capacitor protecting insulating film, and the step of dehydrating the first insulating film by applying a nitrogen-containing plasma treatment to the first insulating film.

7. A method of manufacturing a semiconductor device, comprising the steps of:
- forming a base insulating film on a semiconductor substrate;
- forming capacitor on the base insulating film, the capacitor being constructed by laminating a lower electrode, a capacitor dielectric film composed of a ferroelectric material, and an upper electrode;
- forming a first insulating film covering the capacitors;
- forming a metal wiring on the first insulating film;
- forming a wiring protection insulating film on the metal wiring and on the first insulating film; and
- forming a second insulating film on the wiring protection insulating film by a plasma CVD method where, while a high-frequency bias electric power is applied toward the semiconductor substrate, a plasma-generating high-frequency electric power is applied to a first deposition gas containing oxygen and silicon compound gas, wherein a condition by which moisture content in the wiring protection insulating film becomes less than that in the second insulating film is employed as a deposition condition for the wiring protection insulating film.

8. The method of manufacturing a semiconductor device according to claim 7, wherein the step of forming the wiring protection insulating film is carried out by using any one of:
- a plasma CVD method where, by using a second deposition gas which contains oxygen and silicon compound gas and has a higher oxygen flow rate ratio than in the first deposition gas, and without applying a high-frequency bias electric power toward the semiconductor substrate, only a plasma-generating high-frequency electric power is applied to the second deposition gas;
- a plasma CVD method where, by using the second deposition gas and by setting a pressure of a deposition atmosphere higher than that in the step of forming the first insulating film, and without applying a high-frequency bias electric power toward the semiconductor substrate, only a plasma-generating high-frequency electric power is applied to the second deposition gas; and
- a plasma CVD method where, by using third deposition gas containing TEOS gas and oxidizing gas, and without applying a high-frequency bias electric power toward the semiconductor substrate, only a plasma-generating high-frequency electric power is applied to the third deposition gas.

9. The method of manufacturing a semiconductor device according to claim 7, further comprising the steps of:
- forming a hole in the wiring protection insulating film and the second insulating film on the metal wiring; and
- forming a conductive plug in the hole, the conductive plug being electrically connected to the metal wiring and contain tungsten, wherein a metal laminated film made by laminating at least an aluminum alloy film and a reflection preventing metal film in this order is employed as the metal wiring.

10. The method of manufacturing a semiconductor device according to claim 9, wherein the step of forming the metal wiring comprises the steps of:
- forming the aluminum alloy film on the first insulating film;
- forming the reflection preventing metal film on the aluminum alloy film;
- forming a wiring cap insulating film on the reflection preventing metal film; and
- patterning the wiring cap insulating film, the reflection preventing metal film, and the aluminum alloy film into the metal wiring.

11. The method of manufacturing a semiconductor device according to claim 10, wherein an alumina film is formed as the wiring cap insulating film.

12. The method of manufacturing a semiconductor device according to claim 7, further comprising the step of forming a hydrogen diffusion preventing insulating film covering the wiring before the step of forming the wiring protection insulating film, wherein the wiring protection insulating film is formed on the hydrogen diffusion preventing insulating film.

13. The method of manufacturing a semiconductor device according to claim 12, wherein any one of an alumina film, an aluminum nitride film, a tantalum oxide film, a tantalum nitride film, a titanium oxide film, and a zirconium oxide film is formed as the hydrogen diffusion preventing insulating film.

14. The method of manufacturing a semiconductor device according to claim 7, further comprising any one of the step of dehydrating the wiring protection insulating film by applying a nitrogen-containing plasma treatment to the wiring protection insulating film, and the step of dehydrating the second insulating film by applying a nitrogen-containing plasma treatment to the second insulating film.

* * * * *